US012795962B2

(12) United States Patent
Otani

(10) Patent No.: US 12,795,962 B2
(45) Date of Patent: Nov. 10, 2026

(54) MODULE AND SEMICONDUCTOR COMPOSITE DEVICE

(71) Applicant: Murata Manufacturing Co., Ltd., Nagaokakyo (JP)

(72) Inventor: Shinji Otani, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 337 days.

(21) Appl. No.: 18/678,104

(22) Filed: May 30, 2024

(65) Prior Publication Data

US 2024/0332346 A1 Oct. 3, 2024

Related U.S. Application Data

(63) Continuation of application No. PCT/JP2022/042215, filed on Nov. 14, 2022.

(30) Foreign Application Priority Data

Dec. 1, 2021 (JP) ................................ 2021-195568

(51) Int. Cl.

| | |
|---|---|
| ***H10D 1/68*** | (2025.01) |
| ***H03H 7/01*** | (2006.01) |
| ***H10D 1/20*** | (2025.01) |
| ***H10W 90/00*** | (2026.01) |

(52) U.S. Cl.

CPC ........... *H10D 1/692* (2025.01); *H03H 7/0115* (2013.01); *H10D 1/20* (2025.01); *H10W 90/00* (2026.01)

(58) Field of Classification Search

CPC ........ H10D 1/692; H10D 1/20; H03H 7/0115; H10W 90/00; H01G 4/228; H01G 4/33; H01G 4/38; H01G 9/012; H01G 9/048

See application file for complete search history.

(56) References Cited

U.S. PATENT DOCUMENTS

| | | | | |
|---|---|---|---|---|
| 11,355,289 | B2 | 6/2022 | Furukawa | |
| 2009/0288279 | A1* | 11/2009 | Dattaguru | H01G 4/38 29/25.41 |
| 2011/0050334 | A1 | 3/2011 | Pan et al. | |
| 2020/0312576 | A1* | 10/2020 | Furukawa | H01G 9/26 |
| 2020/0402723 | A1* | 12/2020 | Furukawa | H01G 9/012 |

FOREIGN PATENT DOCUMENTS

| | | | |
|---|---|---|---|
| JP | 2008-186919 | A1 | 8/2008 |
| JP | 2012-074492 | A | 4/2012 |
| JP | 2020-167361 | A | 10/2020 |
| WO | 2019/221046 | A1 | 11/2019 |

OTHER PUBLICATIONS

International Search Report received for PCT Patent Application No. PCT/JP2022/042215, mailed on Jan. 17, 2023, 2 pages (English Translation Only).

* cited by examiner

*Primary Examiner* — Jonathan Han

(74) *Attorney, Agent, or Firm* — ArentFox Schiff LLP

(57) ABSTRACT

A module includes a plurality of stacking layers configured to form a capacitor, one or more through-hole conductors that extend through the plurality of stacking layers in a thickness direction of the plurality of stacking layers, and one or more connection terminals that are patterned in one or more connection terminal layers. The one or more connection terminals are coupled to the one or more through-hole conductors. The one or more connection terminals are patterned with limitations in order to suppress and avoid warping and delamination during heat treatment.

20 Claims, 6 Drawing Sheets

MODULE AND SEMICONDUCTOR COMPOSITE DEVICE

CROSS REFERENCE TO RELATED APPLICATIONS

This application is a continuation of International Application No. PCT/JP2022/042215, filed Nov. 14, 2022, which claims priority to Japanese Patent Application No. 2021-195568, filed Dec. 1, 2021, the entire contents of each of which are hereby incorporated by reference in their entirety.

TECHNICAL FIELD

The present disclosure relates to a module and a semiconductor composite device.

BACKGROUND

U.S. Patent Application Publication No. 2011/0050334, (hereinafter "Patent Document 1") describes a semiconductor device that includes a package substrate in which some or all of passive elements such as an inductor and a capacitor are embedded, and a voltage regulator (voltage control device) including an active element such as a switching element. In the semiconductor device in the related example, the voltage regulator and the load to which the power supply voltage is to be supplied are mounted on the package substrate. In the semiconductor device in the related example, the direct current voltage regulated by the voltage regulator is smoothed by a passive element in the package substrate and is supplied to a load.

In a module having a capacitor portion, such as the package substrate of the semiconductor device described in Patent Document 1, a structure in which a cathode connection terminal layer is led out from a cathode layer of the capacitor portion to the outside of the capacitor portion is adopted, for example. However, when a heat treatment, such as reflow, is performed when the module having the above-described structure according to the related example is incorporated into the semiconductor composite device, it has been found that warping and delamination occur due to a difference in thermal characteristics such as a coefficient of linear expansion between the cathode layer and the cathode connection terminal layer. Such a problem is not recognized in a general multilayer wiring board, an embedded board with general-purpose components embedded in the core substrate, core substrate, an embedded substrate in which a general-purpose component is embedded, or the like, and is a problem specific to the module having the above-described structure.

SUMMARY OF THE INVENTION

The present disclosure has been made in order to solve the above-described problems. In particular, it is an object of the present disclosure to provide a module configured to suppress the occurrence of warping and delamination during the heat treatment. Another object of the present disclosure is to provide a semiconductor composite device including the above-described module.

According to the present disclosure, a module is provided that is configured to be used in a semiconductor composite device that supplies a direct current voltage regulated by a voltage regulator including a semiconductor active element to a load. In this aspect, the module includes a capacitor layer including at least one capacitor portion; a through-hole conductor provided to penetrate the capacitor portion in a thickness direction of the capacitor layer and used for electrical connection between the capacitor portion and at least one of the voltage regulator or the load; and a connection terminal layer electrically connected to the through-hole conductor and used for electrical connection between the capacitor portion and at least one of the voltage regulator or the load, in which the capacitor layer has a first main surface and a second main surface which are opposite to each other in the thickness direction, the connection terminal layer includes a first anode connection terminal layer provided on the first main surface side of the capacitor layer, a second anode connection terminal layer provided on the second main surface side of the capacitor layer, a first cathode connection terminal layer provided on the first main surface side of the capacitor layer, and a second cathode connection terminal layer provided on the second main surface side of the capacitor layer, the first anode connection terminal layer and the second anode connection terminal layer are each electrically connected to an anode of the capacitor portion, the first cathode connection terminal layer and the second cathode connection terminal layer are each electrically connected to a cathode layer of the capacitor portion with a via conductor interposed therebetween, when viewed in the thickness direction, an entirety of the first anode connection terminal layer and the first cathode connection terminal layer and an entirety of the cathode layer overlap each other in terms of area by 90% or more with an area of the entirety of the cathode layer as a reference, and when viewed in the thickness direction, an entirety of the second anode connection terminal layer and the second cathode connection terminal layer and the entirety of the cathode layer overlap each other in terms of area by 90% or more with an area of the entirety of the cathode layer as a reference.

According to some exemplary aspects, a module is provided that includes a plurality of stacking layers configured to form a capacitor, one or more through-hole conductors that extend through the plurality of stacking layers in a thickness direction of the plurality of stacking layers, and one or more connection terminals that are patterned in one or more connection terminal layers. The one or more connection terminals are coupled to the one or more through-hole conductors. The plurality of stacking layers have a first main surface side and a second main surface side which are opposite to each other in the thickness direction. The one or more connection terminals include a first anode connection terminal at the first main surface side of the plurality of stacking layers, a second anode connection terminal at the second main surface side of the plurality of stacking layers, a first cathode connection terminal at the first main surface side of the plurality of stacking layers, and a second cathode connection terminal at the second main surface side of the plurality of stacking layers. The first anode connection terminal and the second anode connection terminal are respectively coupled to an anode of the capacitor. The first cathode connection terminal and the second cathode connection terminal are respectively coupled to a cathode of the capacitor in a cathode layer by one or more via conductors. A first sum of a first overlapped pattern area of the first anode connection terminal with the cathode layer in the thickness direction, and a second overlapped pattern area of the first cathode connection terminal with the cathode layer in the thickness direction is equal to or more than a first pre-determined threshold percentage of a total area of the cathode layer. The first pre-determined threshold percentage is determined based on a target thermal characteristic difference of the one or more connection terminals to the cathode layer in order to suppress warping and delamination during the heat treatment. Further, a second sum of a third overlapped pattern area of the second anode connection terminal with the cathode layer in the thickness direction and a fourth overlapped pattern area of the second cathode connection terminal with the cathode layer in the thickness direction is equal to or more than the first pre-determined threshold percentage of the total area of the cathode layer.

The semiconductor composite device according to the present disclosure includes: the module according to the exemplary embodiment of the voltage regulator; and the load.

According to the present disclosure, a module is provided in which the occurrence of warping and delamination during the heat treatment is suppressed. In addition, according to the present disclosure, a semiconductor composite device is provided that includes the module.

DETAILED DESCRIPTION

Hereinafter, a module according to the exemplary embodiment of the present disclosure and a semiconductor composite device according to the present disclosure will be described. The present disclosure is not limited to the following configurations, and may be modified as appropriate without departing from the gist of the present disclosure. In addition, the present disclosure also includes a combination of a plurality of individual configurations described below.

Each exemplary embodiment shown below is an example, and it goes without saying that partial replacement or combination of configurations shown in different exemplary embodiments is possible. In Embodiment 2 and subsequent embodiments, descriptions of matters common to Embodiment 1 will be omitted, and different points will be mainly described. In particular, similar actions and effects due to similar configurations will not be mentioned sequentially for each embodiment.

In the following description, in a case where each exemplary embodiment is not particularly distinguished, the module is simply referred to as "module according to the present disclosure" and "semiconductor composite device according to the present disclosure".

The drawings shown below are schematic diagrams, and the dimensions, aspect ratio scale, and the like may differ from an actual product.

Embodiment 1

The semiconductor composite device according to the present disclosure includes the module according to the present disclosure, a voltage regulator, and a load.

Figure 1:
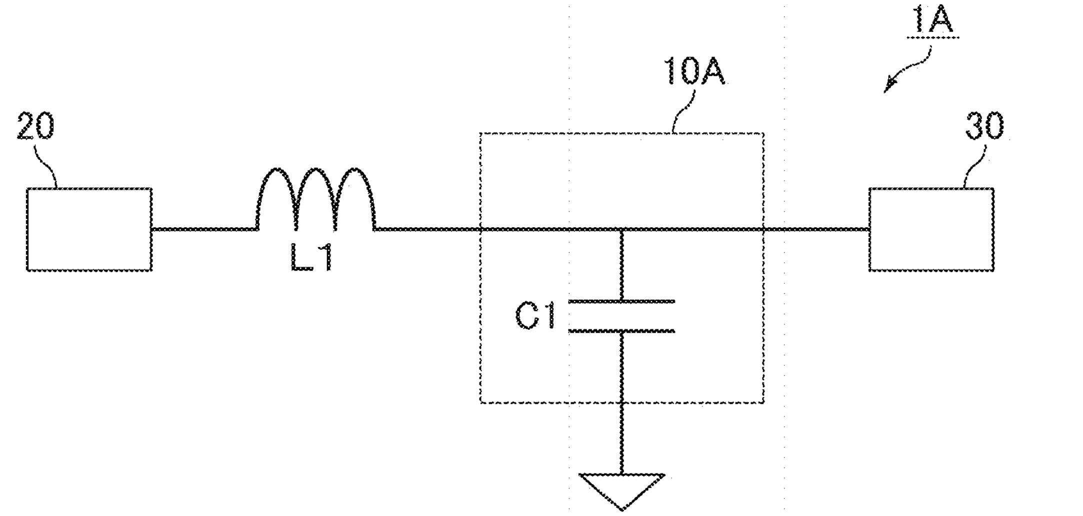
FIG. 1 is a circuit configuration diagram showing an example of a semiconductor composite device according to Embodiment 1 of the present disclosure.

FIG. 1 is a circuit configuration diagram showing an example of a semiconductor composite device according to Embodiment 1 of the present disclosure.

A semiconductor composite device 1A shown in FIG. 1 includes a module 10A, a voltage regulator 20, and a load 30.

The voltage regulator 20 includes a semiconductor active element (not shown). The voltage regulator 20 adjusts a direct current voltage supplied from the outside to a voltage level suitable for the load 30 by controlling a duty of the semiconductor active element.

Examples of the semiconductor active element included in the voltage regulator 20 include a switching element.

The load 30 is supplied with a direct current voltage regulated by the voltage regulator 20.

Examples of the load 30 include a semiconductor integrated circuit (IC) such as a logical operation circuit and a storage circuit.

The module according to the present disclosure is used for a semiconductor composite device that supplies a direct current voltage regulated by a voltage regulator including a semiconductor active element to a load.

The module 10A is provided between the voltage regulator 20 and the load 30. As a result, the module 10A is used for the semiconductor composite device 1A that supplies the direct current voltage regulated by the voltage regulator 20 to the load 30.

The module 10A includes a capacitor portion C1.

The capacitor portion C1 is provided between the ground terminal and a point between the voltage regulator 20 and the load 30.

As shown in FIG. 1, the semiconductor composite device 1A may further include an inductor L1.

The inductor L1 is provided between the voltage regulator 20 and the load 30. In this case, as shown in FIG. 1, the capacitor portion C1 is provided between the ground terminal and a point between the inductor L1 and the load 30.

In addition, the inductor L1 may be included in the module 10A.

The semiconductor composite device 1A may further include electronic equipment such as a decoupling capacitor for noise countermeasures, a choke inductor, a diode element for surge protection, and a resistor element for voltage division.

Figure 2:
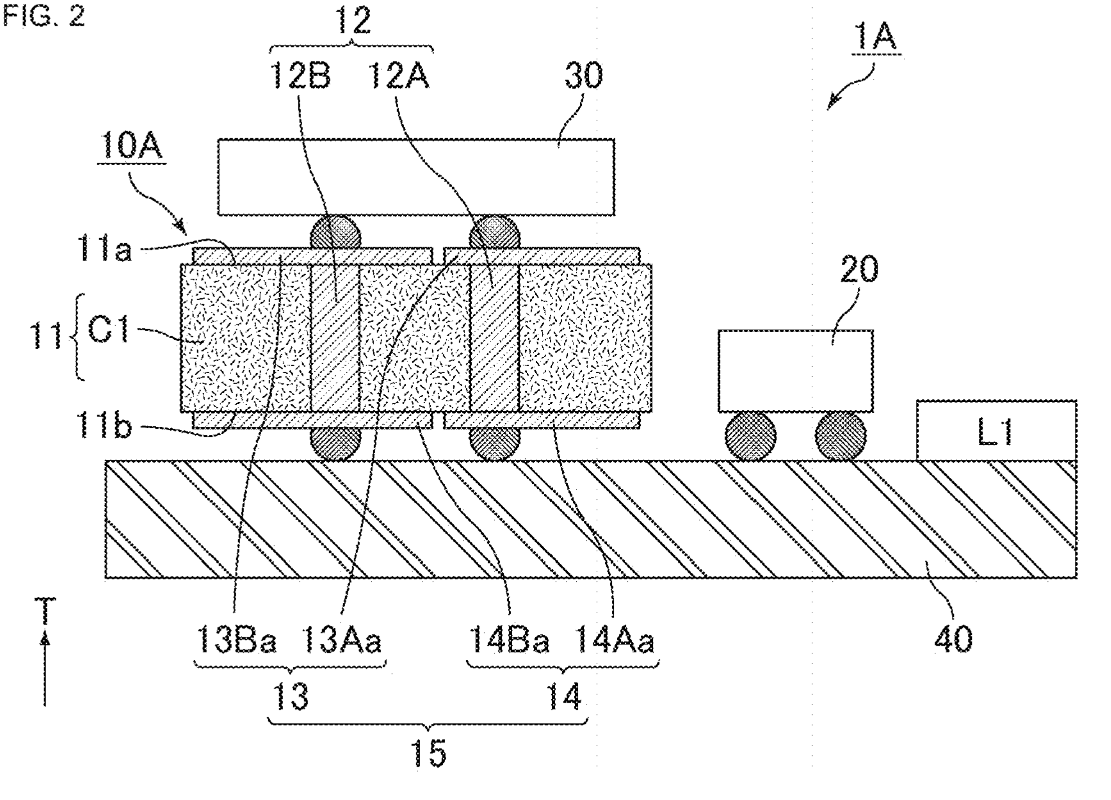
FIG. 2 is a schematic cross-sectional view showing an example of a semiconductor composite device according to Embodiment 1 of the present disclosure.

FIG. 2 is a schematic cross-sectional view showing an example of a semiconductor composite device according to Embodiment 1 of the present disclosure.

In the present specification, a thickness direction is a direction determined by T as shown in FIG. 2 and the like.

The semiconductor composite device 1A shown in FIG. 2 is mounted on a mother substrate 40.

The module 10A is mounted on one main surface of the mother substrate 40.

The voltage regulator 20 is mounted on one main surface of the mother substrate 40 at a position different from the position of the module 10A.

The load 30 is mounted on one main surface of the module 10A, in an exemplary embodiment, on a main surface of the module 10A on a side opposite to the mother substrate 40.

The inductor L1 is mounted on one main surface of the mother substrate 40 at a position different from the positions of the module 10A and the voltage regulator 20. The inductor L1 is electrically connected to the semiconductor active element (not shown) included in the voltage regulator 20 with a circuit layer (not shown) including a wiring interposed therebetween.

The module according to the present disclosure includes a capacitor layer including at least one capacitor portion; a through-hole conductor provided to penetrate the capacitor portion in a thickness direction of the capacitor layer and used for the electrical connection between the capacitor portion and at least one of the voltage regulator or the load; and a connection terminal layer electrically connected to the through-hole conductor and used for the electrical connection between the capacitor portion and at least one of the voltage regulator or the load.

The module 10A shown in FIG. 2 includes a capacitor layer 11, a through-hole conductor 12, and a connection terminal layer 15.

The capacitor layer 11 has at least one capacitor portion. In the example shown in FIG. 2, the capacitor layer 11 has one capacitor portion C1.

In the module according to the present disclosure, the capacitor layer includes a first main surface and a second main surface which are provided to be opposite to each other in the thickness direction.

The capacitor layer 11 includes a first main surface 11*a* and a second main surface 11*b*, which are opposite to each other in a thickness direction T.

The through-hole conductor 12 is provided to penetrate the capacitor portion C1 in the thickness direction T of the capacitor layer 11. In the example shown in FIG. 2, the through-hole conductor 12 includes a first through-hole conductor 12A and a second through-hole conductor 12B. The first through-hole conductor 12A and the second through-hole conductor 12B are each provided to penetrate the capacitor portion C1 in the thickness direction T of the capacitor layer 11.

The through-hole conductor 12 is used for the electrical connection between the capacitor portion C1 and at least one of the voltage regulator 20 or the load 30. In the example shown in FIG. 2, the first through-hole conductor 12A and the second through-hole conductor 12B are each used for the electrical connection between the capacitor portion C1 and the load 30.

The connection terminal layer 15 is electrically connected to the through-hole conductor 12. In the example shown in FIG. 2, the connection terminal layer 15 includes a first connection terminal layer 13 and a second connection terminal layer 14. The first connection terminal layer 13 is provided on the first main surface 11*a* side of the capacitor layer 11 and is electrically connected to the through-hole conductor 12. The second connection terminal layer 14 is provided on the second main surface 11*b* side of the capacitor layer 11 and is electrically connected to the through-hole conductor 12.

The first connection terminal layer 13 includes a first connection terminal layer 13Aa and a first connection terminal layer 13Ba. The first connection terminal layer 13Aa is provided on an end portion of the first through-hole conductor 12A on the first main surface 11*a* side of the capacitor layer 11, and is connected to the first through-hole conductor 12A. The first connection terminal layer 13Ba is provided on the end portion on the first main surface 11*a* side of the capacitor layer 11 in the second through-hole conductor 12B, and is connected to the second through-hole conductor 12B.

The second connection terminal layer 14 includes a second connection terminal layer 14Aa and a second connection terminal layer 14Ba. The second connection terminal layer 14Aa is provided on the end portion on the second main surface 11*b* side of the capacitor layer 11 in the first through-hole conductor 12A, and is connected to the first through-hole conductor 12A. The second connection terminal layer 14Ba is provided on the end portion on the second main surface 11*b* side of the capacitor layer 11 in the second through-hole conductor 12B, and is connected to the second through-hole conductor 12B.

The connection terminal layer 15 is used for the electrical connection between the capacitor portion C1 and at least one of the voltage regulator 20 or the load 30. In the example shown in FIG. 2, the first connection terminal layer 13Aa and the first connection terminal layer 13Ba included in the first connection terminal layer 13 are each used for the electrical connection between the capacitor portion C1 and the load 30.

As described above, in the semiconductor composite device 1A, the voltage regulator 20 and the load 30 are electrically connected to each other with the through-hole conductor and the connection terminal layer of the module 10A interposed therebetween. As a result, in the semiconductor composite device 1A, the wiring path between the voltage regulator 20 and the load 30 is likely to be shortened, and as a result, the loss due to the wiring can be reduced.

In the module according to the present disclosure, the connection terminal layer includes a first anode connection terminal layer provided on the first main surface side of the capacitor layer; a second anode connection terminal layer provided on the second main surface side of the capacitor layer; a first cathode connection terminal layer provided on the first main surface side of the capacitor layer; and a second cathode connection terminal layer provided on the second main surface side of the capacitor layer.

In the module according to the present disclosure, each of the first anode connection terminal layer and the second anode connection terminal layer is electrically connected to the anode of the capacitor portion.

Hereinafter, the first connection terminal layer 13Aa shown in FIG. 2 is referred to as a first anode connection terminal layer, and the second connection terminal layer 14Aa shown in FIG. 2 is referred to as a second anode connection terminal layer.

Hereinafter, the first through-hole conductor 12A shown in FIG. 2 will be referred to as an anode through-hole conductor. The anode through-hole conductor is provided on at least an inner wall surface of an anode through-hole penetrating the capacitor portion in the thickness direction, and is electrically connected to an anode of the capacitor portion.

In the module according to the present disclosure, each of the first cathode connection terminal layer and the second cathode connection terminal layer is electrically connected to the cathode layer of the capacitor portion with a via conductor interposed therebetween.

Hereinafter, the first connection terminal layer 13Ba shown in FIG. 2 is referred to as a first cathode connection terminal layer, and the second connection terminal layer 14Ba shown in FIG. 2 is referred to as a second cathode connection terminal layer.

Hereinafter, the second through-hole conductor 12B shown in FIG. 2 will be referred to as a cathode through-hole conductor. The cathode through-hole conductor is provided on at least an inner wall surface of a cathode through-hole that penetrates the capacitor portion in the thickness direction, and is electrically connected to the cathode layer of the capacitor portion.

Figure 3:
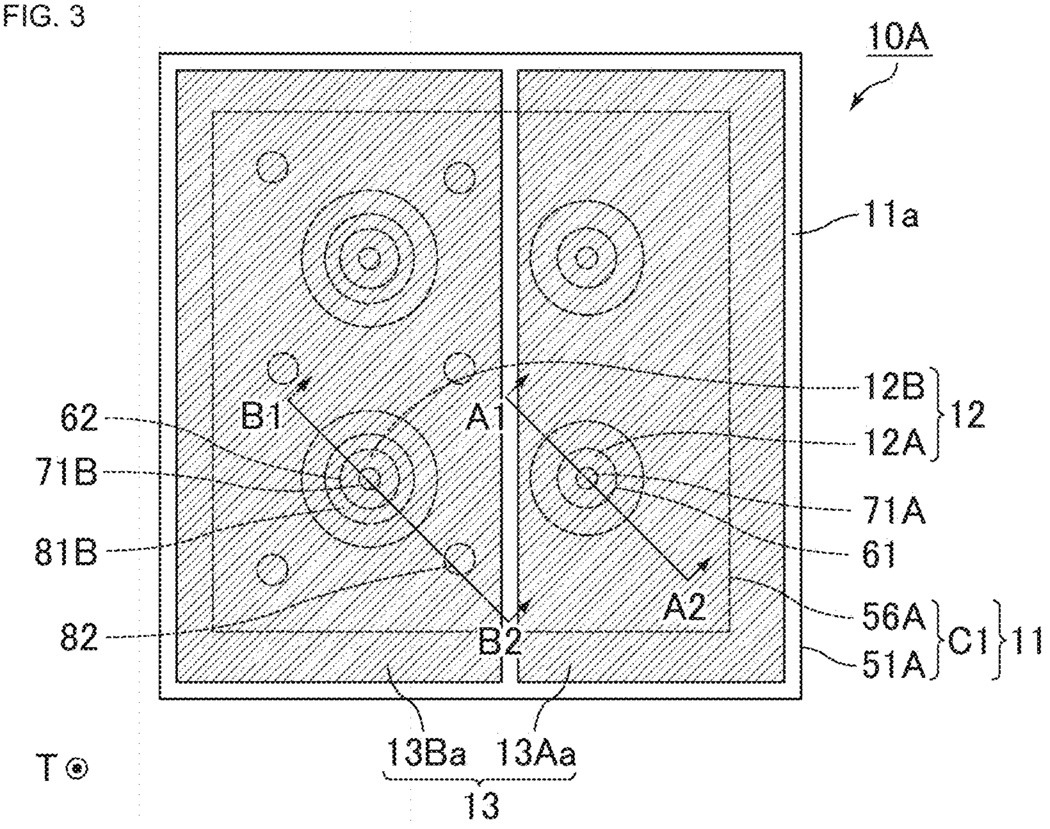
FIG. 3 is a schematic plan view showing an example of a state where the module shown in FIG. 2 is viewed from one main surface side.
Figure 4:
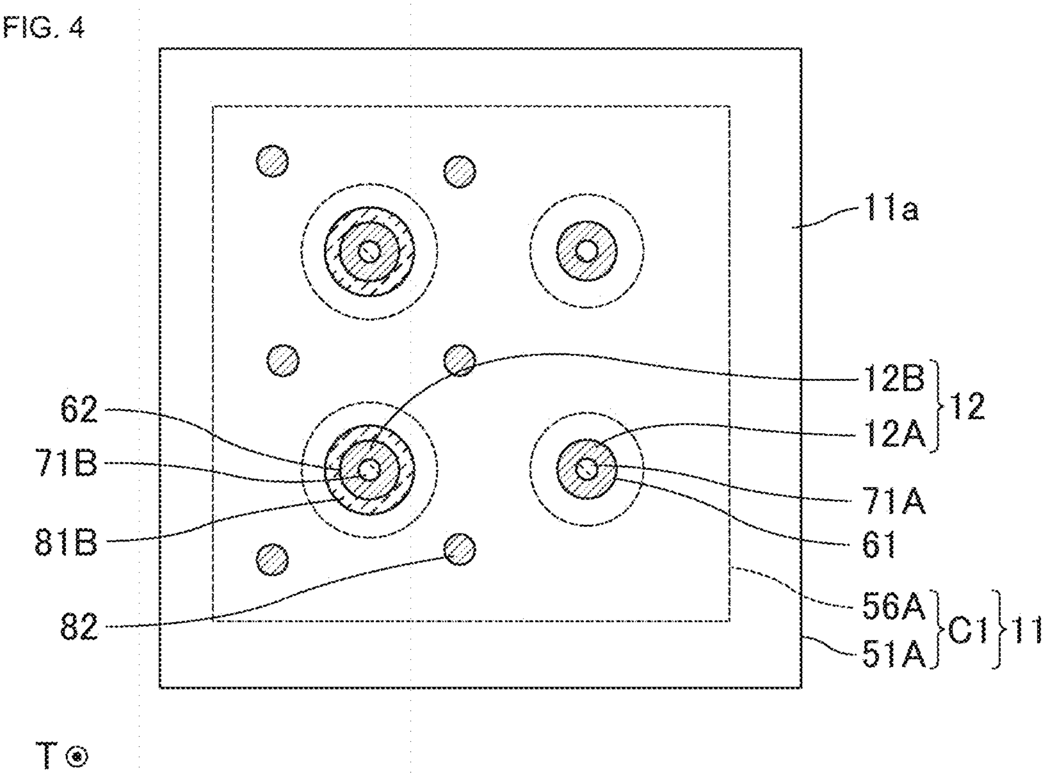
FIG. 4 is a schematic plan view showing a state where a first anode connection terminal layer and a first cathode connection terminal layer are removed from the module shown in FIG. 3.

FIG. 3 is a schematic plan view showing an example of a state where the module shown in FIG. 2 is viewed from one main surface side. FIG. 4 is a schematic plan view showing a state where the first anode connection terminal layer and the first cathode connection terminal layer are excepted from the module shown in FIG. 3.

In the module 10A shown in FIG. 3, the first connection terminal layer 13 includes the first anode connection terminal layer 13Aa and the first cathode connection terminal layer 13Ba. The first anode connection terminal layer 13Aa and the first cathode connection terminal layer 13Ba are each provided on the first main surface 11*a* side of the capacitor layer 11.

The first anode connection terminal layer 13Aa is electrically connected to the anode plate 51A of the capacitor portion C1 with the anode through-hole conductor 12A interposed therebetween.

The anode through-hole conductor 12A is provided to penetrate the capacitor portion C1 in the thickness direction T of the capacitor layer 11. In an exemplary embodiment, as will be described later, the anode through-hole conductor 12A is provided on at least an inner wall surface of the anode through-hole 61 that penetrates the capacitor portion C1 in the thickness direction T, and is electrically connected to the anode plate 51A of the capacitor portion C1.

In the example shown in FIGS. 3 and 4, two anode through-hole conductors 12A are provided. In addition, the number of anode through-hole conductors 12A may be one or three or more. That is, the number of anode through-hole conductors 12A may be one or a plurality.

The first cathode connection terminal layer 13Ba is electrically connected to the cathode layer 56A of the capacitor portion C1 with a via conductor 82 interposed therebetween. In the example shown in FIGS. 3 and 4, the first cathode connection terminal layer 13Ba is electrically connected to the cathode layer 56A of the capacitor portion C1 with the via conductor 82 and the cathode through-hole conductor 12B interposed therebetween.

The cathode through-hole conductor 12B is provided to penetrate the capacitor portion C1 in the thickness direction T of the capacitor layer 11. In an exemplary embodiment, as will be described later, the cathode through-hole conductor 12B is provided on at least an inner wall surface of a cathode through-hole 62 that penetrates the capacitor portion C1 in the thickness direction T, and is electrically connected to the cathode layer 56A of the capacitor portion C1.

In the example shown in FIGS. 3 and 4, two cathode through-hole conductors 12B are provided. In addition, the number of cathode through-hole conductors 12B may be one or three or more. That is, the number of cathode through-hole conductors 12B may be one or a plurality.

In the examples shown in FIGS. 3 and 4, the capacitor portion C1 is configured in the region where the anode plate 51A and the cathode layer 56A overlap each other. That is, in the examples shown in FIGS. 3 and 4, the planar shape of the capacitor portion C1 is rectangular. In the present specification, a rectangle means a square or a rectangle. In addition, the planar shape of the capacitor portion C1 may be, for example, a quadrangle other than a rectangle, a polygonal shape such as a triangle, a pentagon, and a hexagon, a shape including a curved portion, a circular shape, an elliptical shape, or the like.

In the module according to the present disclosure, when viewed in the thickness direction, the entirety of the first anode connection terminal layer and the first cathode connection terminal layer and the entirety of the cathode layer overlap each other in terms of area by 90% or more with the area of the entirety of the cathode layer as a reference.

In the module 10A shown in FIG. 3, when viewed in the thickness direction T, the entirety of the first anode connection terminal layer 13Aa and the first cathode connection terminal layer 13Ba and the entirety of the cathode layer 56A overlap each other in terms of area by 90% or more with the area of the entirety of the cathode layer 56A as a reference.

In addition, when the cathode layer 56A is provided on both main surfaces of the anode plate 51A as will be described later, in the example shown in FIG. 3, the "area of the entirety of the cathode layer 56A" refers to the entirety of the cathode layer 56A provided on the first main surface 11*a* side of the capacitor layer 11.

That is, in the module 10A, when viewed in the thickness direction T, when the area of a region where the entirety of the first anode connection terminal layer 13Aa and the first cathode connection terminal layer 13Ba and the entirety of the cathode layer 56A overlap each other is referred to as E1 and the area of the entirety of the cathode layer 56A is referred to as F1, $E1 \geq F1 \times 0.9$ is satisfied.

In the module 10A, it is noted that, when viewed in the thickness direction T, the entirety of the first anode connection terminal layer 13Aa and the first cathode connection terminal layer 13Ba and the entirety of the cathode layer 56A overlap each other in terms of area by 90% or more and less than 100% with the area of the entirety of the cathode layer 56A as a reference. That is, in the module 10A, in some exemplary embodiments, $F1 \times 0.9 \leq E1 < F1$ is satisfied.

The area of the region where the entirety of the first anode connection terminal layer and the first cathode connection terminal layer and the entirety of the cathode layer overlap each other when viewed in the thickness direction, in an exemplary embodiment, when viewed from the first main surface side of the capacitor layer, and the area of the entirety of the cathode layer are measured using an X-ray CT apparatus. In addition, in a case where, in the non-destructive state of the module, it is difficult to measure the area of the entirety of the cathode layer when viewed in the thickness direction, in an exemplary embodiment, when viewed from the first main surface side of the capacitor layer, due to the influence of the first anode connection terminal layer and the first cathode connection terminal layer, when the module is polished to a position where the entirety of the cathode layer can be seen from the first main surface side of the capacitor layer, the area of the entirety of the cathode layer can be easily measured.

Figure 5:
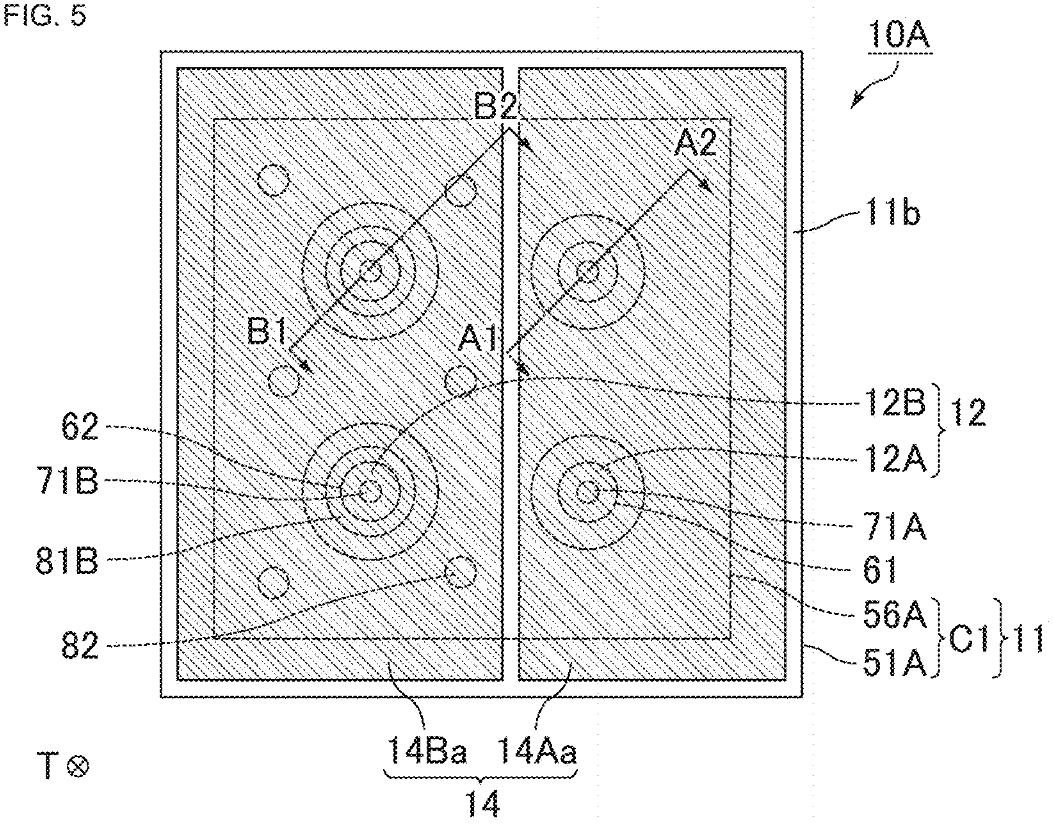
FIG. 5 is a schematic plan view showing an example of a state where the module shown in FIG. 2 is viewed from the other main surface side.

FIG. 5 is a schematic plan view showing an example of a state where the module shown in FIG. 2 is viewed from the other main surface side.

In the module 10A shown in FIG. 5, the second connection terminal layer 14 includes the second anode connection terminal layer 14Aa and the second cathode connection terminal layer 14Ba. The second anode connection terminal layer 14Aa and the second cathode connection terminal layer 14Ba are each provided on the second main surface 11*b* side of the capacitor layer 11.

The second anode connection terminal layer 14Aa is electrically connected to the anode plate 51A of the capacitor portion C1 with the anode through-hole conductor 12A interposed therebetween.

The second cathode connection terminal layer 14Ba is electrically connected to the cathode layer 56A of the capacitor portion C1 with the via conductor 82 interposed therebetween. In the example shown in FIG. 5, the second cathode connection terminal layer 14Ba is electrically connected to the cathode layer 56A of the capacitor portion C1 with the via conductor 82 and the cathode through-hole conductor 12B interposed therebetween.

In the module according to the present disclosure, when viewed in the thickness direction, the entirety of the second anode connection terminal layer and the second cathode connection terminal layer and the entirety of the cathode layer overlap each other in terms of area by 90% or more with the area of the entirety of the cathode layer as a reference.

In the module 10A shown in FIG. 5, when viewed in the thickness direction T, the entirety of the second anode connection terminal layer 14Aa and the second cathode connection terminal layer 14Ba and the entirety of the entire cathode layer 56A overlap each other in terms of area by 90% or more with the area of the entirety of the cathode layer 56A as a reference.

In addition, when the cathode layer 56A is provided on both main surfaces of the anode plate 51A as will be described later, in the example shown in FIG. 5, the "area of the entirety of the cathode layer 56A" refers to the entirety of the cathode layer 56A provided on the second main surface 11*b* side of the capacitor layer 11.

That is, in the module 10A, when viewed in the thickness direction T, when the area of a region where the entirety of the second anode connection terminal layer 14Aa and the second cathode connection terminal layer 14Ba and the entirety of the cathode layer 56A overlap each other is referred to as E2 and the area of the entirety of the cathode layer 56A is referred to as F2, $E2 \geq F2 \times 0.9$ is satisfied.

In the module 10A, according to an exemplary aspect, when viewed in the thickness direction T, the entirety of the second anode connection terminal layer 14Aa and the second cathode connection terminal layer 14Ba and the entirety of the cathode layer 56A overlap each other in terms of area by 90% or more and less than 100% with the area of the entirety of the cathode layer 56A as a reference. That is, in the module 10A, according to an exemplary aspect, $F2 \times 0.9 \leq E2 < F2$ is satisfied.

The area of the region where the entirety of the second anode connection terminal layer and the second cathode connection terminal layer and the entirety of the cathode layer overlap each other when viewed in the thickness direction, in an exemplary embodiment, when viewed from the second main surface side of the capacitor layer, and the area of the entirety of the cathode layer are measured using an X-ray CT apparatus. In addition, in a case where, in the non-destructive state of the module, it is difficult to measure the area of the entirety of the cathode layer when viewed in the thickness direction, in an exemplary embodiment, when viewed from the second main surface side of the capacitor layer, due to the influence of the second anode connection terminal layer and the second cathode connection terminal layer, when the module is polished to a position where the entirety of the cathode layer can be seen from the second main surface side of the capacitor layer, the area of the entirety of the cathode layer can be easily measured.

As described above, in the module 10A, the entirety of the first anode connection terminal layer 13Aa and the first cathode connection terminal layer 13Ba and the entirety of the cathode layer 56A overlap each other in terms of area by 90% or more with the area of the entirety of the cathode layer 56A as a reference when viewed in the thickness direction T, and the entirety of the second anode connection terminal layer 14Aa and the second cathode connection terminal layer 14Ba and the entirety of the cathode layer 56A overlap each other in terms of area by 90% or more with the area of the entirety of the cathode layer 56A as a reference when viewed in the thickness direction T. Accordingly, even when there is a difference in thermal characteristics such as a coefficient of linear expansion between the entirety of the first anode connection terminal layer 13Aa and the first cathode connection terminal layer 13Ba and the entirety of the cathode layer 56A, and between the entirety of the second anode connection terminal layer 14Aa and the second cathode connection terminal layer 14Ba and the entirety of the cathode layer 56A, the occurrence of warping and delamination during the heat treatment is suppressed. Further, in the module 10A, since the occurrence of warping and delamination during the heat treatment is suppressed, the stress caused by the warping and the delamination is relaxed, and thus, in particular, an interface or the like of a member formed of different materials is less likely to be damaged during the heat treatment.

When viewed in the thickness direction T, the area of the region where the entirety of the first anode connection terminal layer 13Aa and the first cathode connection terminal layer 13Ba and the entirety of the cathode layer 56A overlap each other and the area of the region where the entirety of the second anode connection terminal layer 14Aa and the second cathode connection terminal layer 14Ba and the entirety of the cathode layer 56A may be the same as or different from each other, but are the same as each other.

When the cathode layer 56A is provided on both main surfaces of the anode plate 51A as will be described later, the area of the entirety of the cathode layer 56A provided on the first main surface 11*a* side of the capacitor layer 11 and the area of the entirety of the cathode layer 56A provided on the second main surface 11*b* side of the capacitor layer 11 when viewed in the thickness direction T may be the same as or different from each other, but are the same as each other.

In the module according to the present disclosure, when viewed in the thickness direction, the entirety of the first anode connection terminal layer and the first cathode connection terminal layer and the entirety of the second anode connection terminal layer and the second cathode connection terminal layer overlap each other in terms of area by 95% or more with a smaller area of the area of the entirety of the first anode connection terminal layer and the first cathode connection terminal layer and the area of the entirety of the second anode connection terminal layer and the second cathode connection terminal layer as a reference.

In the module 10A shown in FIGS. 3 and 5, when viewed in the thickness direction T, the entirety of the first anode connection terminal layer 13Aa and the first cathode connection terminal layer 13Ba and the entirety of the second anode connection terminal layer 14Aa and the second cathode connection terminal layer 14Ba overlap each other in terms of area by 95% or more with a smaller area of the area of the entirety of the first anode connection terminal layer 13Aa and the first cathode connection terminal layer 13Ba and the area of the entirety of the second anode connection terminal layer 14Aa and the second cathode connection terminal layer 14Ba as a reference.

That is, in the module 10A, when viewed in the thickness direction T, when the area of the region where the entirety of the first anode connection terminal layer 13Aa and the first cathode connection terminal layer 13Ba and the entirety of the second anode connection terminal layer 14Aa and the second cathode connection terminal layer 14Ba overlap each other in the thickness direction is referred to as G, and a smaller area of the area of the entirety of the first anode connection terminal layer 13Aa and the first cathode connection terminal layer 13Ba and the area of the entirety of the second anode connection terminal layer 14Aa and the second cathode connection terminal layer 14Ba is referred to as H, according to an exemplary aspect $G \geq H \times 0.95$ is satisfied.

In the module 10A, when viewed in the thickness direction T, the entirety of the first anode connection terminal layer 13Aa and the first cathode connection terminal layer 13Ba and the entirety of the second anode connection terminal layer 14Aa and the second cathode connection terminal layer 14Ba overlap each other in terms of area by 95% or more with a smaller area of the area of the entirety of the first anode connection terminal layer 13Aa and the first cathode connection terminal layer 13Ba and the area of the entirety of the second anode connection terminal layer 14Aa and the second cathode connection terminal layer 14Ba as a reference. Accordingly, the occurrence of warping and delamination during the heat treatment is sufficiently suppressed.

In the module 10A, when viewed in the thickness direction T, the entirety of the first anode connection terminal layer 13Aa and the first cathode connection terminal layer 13Ba and the entirety of the second anode connection terminal layer 14Aa and the second cathode connection terminal layer 14Ba overlap each other in terms of area by 95% or more and 100% or less with a smaller area of the area of the entirety of the first anode connection terminal layer 13Aa and the first cathode connection terminal layer 13Ba and the area of the entirety of the second anode connection terminal layer 14Aa and the second cathode connection terminal layer 14Ba as a reference. That is, in the module 10A, according to an exemplary aspect, $H \times 0.95 \leq G \leq H$ is satisfied.

In the example shown in FIGS. 3 and 5, when viewed in the thickness direction T, the area of the entirety of the first anode connection terminal layer 13Aa and the first cathode connection terminal layer 13Ba and the area of the entirety of the second anode connection terminal layer 14Aa and the second cathode connection terminal layer 14Ba are the same as each other, and the entirety of the first anode connection terminal layer 13Aa and the first cathode connection terminal layer 13Ba and the entirety of the second anode connection terminal layer 14Aa and the second cathode connection terminal layer 14Ba overlap each other in terms of area by 100%. In this manner, in the module 10A, when viewed in the thickness direction T, according to an exemplary aspect, the entirety of the first anode connection terminal layer 13Aa and the first cathode connection terminal layer 13Ba and the entirety of the second anode connection terminal layer 14Aa and the second cathode connection terminal layer 14Ba overlap each other in terms of area by 100% with a smaller area of the area of the entirety of the first anode connection terminal layer 13Aa and the first cathode connection terminal layer 13Ba and the area of the entirety of the second anode connection terminal layer 14Aa and the second cathode connection terminal layer 14Ba as a reference. That is, in the module 10A, according to an exemplary aspect. G=H is satisfied.

When viewed in the thickness direction T, the area of the entirety of the first anode connection terminal layer 13Aa and the first cathode connection terminal layer 13Ba and the area of the entirety of the second anode connection terminal layer 14Aa and the second cathode connection terminal layer 14Ba may be the same as each other as shown in FIGS. 3 and 5, or may be different from each other, or may be the same as each other.

When viewed in the thickness direction, the area of the entirety of the first anode connection terminal layer and the first cathode connection terminal layer, the area of the entirety of the second anode connection terminal layer and the second cathode connection terminal layer, and the area of the region where the entirety of the first anode connection terminal layer and the first cathode connection terminal layer and the entirety of the second anode connection terminal layer and the second cathode connection terminal layer overlap each other are measured using an X-ray CT apparatus.

Figure 6:
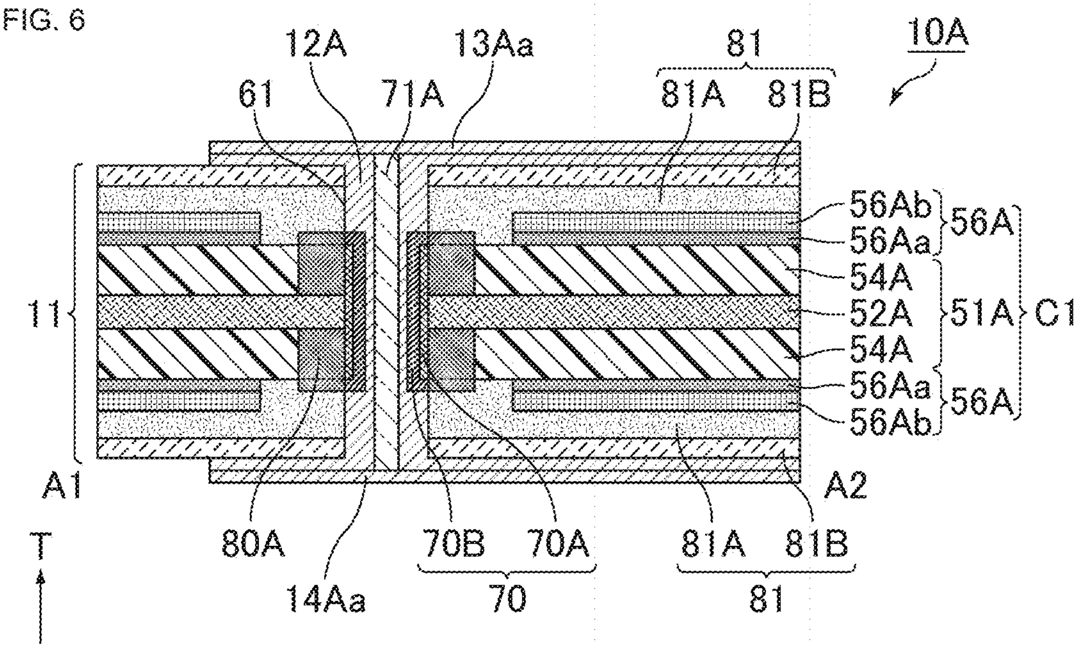
FIG. 6 is a schematic cross-sectional view showing an example of a cross section taken along a line segment A1-A2 of the modules shown in FIGS. 3 and 5.

FIG. 6 is a schematic cross-sectional view showing an example of a cross section taken along a line segment A1-A2 of the modules shown in FIGS. 3 and 5.

In the module 10A shown in FIG. 6, the capacitor layer 11 includes the capacitor portion C1.

The capacitor portion C1 includes the anode plate 51A, a dielectric layer (not shown), and the cathode layer 56A.

The anode plate 51A configures an anode of the capacitor portion C1.

The anode plate 51A includes a core portion 52A and a porous layer 54A.

In some exemplary embodiments, the core portion 52A is made of a metal, such as made of a valve action metal.

Examples of the valve action metal include a metal element such as aluminum, tantalum, niobium, titanium, and zirconium, and an alloy containing at least one of these metal elements. Among these, aluminum or an aluminum alloy is used in some exemplary embodiments.

The porous layer 54A is provided on at least one main surface of the core portion 52A. That is, the porous layer 54A may be provided on only one main surface of the core portion 52A, or may be provided on both main surfaces of the core portion 52A as shown in FIG. 6. As described above, the anode plate 51A includes the porous layer 54A on at least one main surface.

The porous layer 54A is an etching layer obtained by subjecting the surface of the anode plate 51A to an etching treatment.

The shape of the anode plate 51A is a flat plate shape, for example a foil shape. As described above, in the present specification, "plate-like" also includes "foil-like".

The dielectric layer is provided on the surface of the porous layer 54A. In an exemplary embodiment, the dielectric layer is provided along the surface (contour) of each hole present in the porous layer 54A.

According to an exemplary aspect that the dielectric layer consists of the above-described oxide film of the valve action metal. For example, when the anode plate 51A is an aluminum foil, an oxide film serving as a dielectric layer is formed on the anode plate 51A by performing an anodization treatment (also referred to as a chemical conversion treatment) in an aqueous solution containing ammonium adipate or the like. Since the dielectric layer is formed along the surface of the porous layer 54A, the dielectric layer is provided with pores (concave portions).

The cathode layer 56A configures the cathode of the capacitor portion C1.

The cathode layer 56A is provided on the surface of the dielectric layer.

As shown in FIG. 6, the cathode layer 56A includes a solid electrolyte layer 56Aa provided on the surface of the dielectric layer, and a conductor layer 56Ab provided on the surface of the solid electrolyte layer 56Aa.

Examples of a constituent material of the solid electrolyte layer 56Aa include conductive polymers such as polypyrroles, polythiophenes, and polyanilines. Among these, polythiophenes are used in some exemplary embodiments, and poly(3,4-ethylenedioxythiophene) (PEDOT) is used in some exemplary embodiments. In addition, the conductive polymer may contain a dopant such as polystyrene sulfonic acid (PSS).

The solid electrolyte layer 56Aa includes an inner layer that is filled in the pores (concave portions) of the dielectric layer and an outer layer that covers the surface of the dielectric layer.

The conductor layer 56Ab includes at least one of the conductive resin layer or the metal layer. That is, the conductor layer 56Ab may include only the conductive resin layer, may include only the metal layer, or may include both the conductive resin layer and the metal layer.

Examples of the conductive resin layer include a conductive adhesive layer containing at least one conductive filler selected from the group consisting of a silver filler, a copper filler, a nickel filler, and a carbon filler.

Examples of the metal layer include a metal plating film and a metal foil. The metal layer consists of at least one metal selected from the group consisting of nickel, copper, silver, and an alloy containing at least one of these metals.

In the present specification, the main component means an element component having the highest weight proportion.

The conductor layer 56Ab may include, for example, a carbon layer provided on the surface of the solid electrolyte layer 56Aa and a copper layer provided on the surface of the carbon layer.

The carbon layer is formed in a predetermined region, for example, by coating the surface of the solid electrolyte layer 56Aa with a carbon paste by a sponge transfer method, a screen printing method, a dispenser coating method, an ink jet printing method, or the like.

The copper layer is formed in a predetermined region, for example, by coating the surface of the carbon layer with a copper paste by a sponge transfer method, a screen printing method, a spray coating method, a dispenser coating method, an ink jet printing method, or the like.

As described above, the capacitor portion C1 shown in FIG. 6 includes the anode plate 51A having the porous layer 54A on at least one main surface, the dielectric layer provided on the surface of the porous layer 54A, and the cathode layer 56A provided on the surface of the dielectric layer. As a result, the capacitor portion C1 configures an electrolytic capacitor. In addition, when the cathode layer 56A has the solid electrolyte layer 56Aa, the capacitor portion C1 configures a solid electrolytic capacitor.

In addition, the capacitor portion may configure a ceramic capacitor using barium titanate, or a thin film capacitor using silicon nitride (SiN), silicon dioxide ($SiO_2$), hydrogen fluoride (HF), or the like. However, from the viewpoint of thinning and enlarging the capacitor portion, and improving mechanical properties such as rigidity and flexibility of the capacitor portion, the capacitor portion configures a capacitor having a metal such as aluminum as a base material, configures an electrolytic capacitor having a metal such as aluminum as a base material, and configures an electrolytic capacitor having aluminum or aluminum alloy as a base material.

In the module according to the present disclosure, the above-described through-hole conductor may include an anode through-hole conductor provided on at least an inner wall surface of an anode through-hole penetrating the capacitor portion in the thickness direction, and the anode through-hole conductor may be electrically connected to the anode of the capacitor portion on the inner wall surface of the anode through-hole.

The anode through-hole conductor 12A is provided to penetrate the capacitor portion C1 in the thickness direction T of the capacitor layer 11. In the example shown in FIG. 6, the anode through-hole conductor 12A is provided on at least the inner wall surface of the anode through-hole 61 penetrating the capacitor portion C1 in the thickness direction T, and is electrically connected to the anode plate 51A.

The anode through-hole conductor 12A is electrically connected to the anode plate 51A on the inner wall surface of the anode through-hole 61. In the example shown in FIG. 6, the anode through-hole conductor 12A is electrically connected to the end surface of the anode plate 51A facing the inner wall surface of the anode through-hole 61 in a direction orthogonal to the thickness direction T.

As described above, when the anode through-hole conductor 12A is electrically connected to the anode plate 51A on the inner wall surface of the anode through-hole 61 in the module 10A, when stress is applied to the first anode connection terminal layer 13Aa and the second anode connection terminal layer 14Aa connected to the anode through-hole conductor 12A during the heat treatment, the stress is transmitted to the capacitor layer 11 having the anode plate 51A with the anode through-hole conductor 12A interposed therebetween, and thus the capacitor layer 11 is likely to be damaged by the stress. On the other hand, in the module 10A, as described above, since the occurrence of warping and delamination during the heat treatment is suppressed, the capacitor layer 11 is less likely to be damaged by stress even when the anode through-hole conductor 12A is electrically connected to the anode plate 51A on the inner wall surface of the anode through-hole 61.

As shown in FIG. 6, according to an exemplary aspect, the core portion 52A and the porous layer 54A are exposed on the end surface of the anode plate 51A electrically connected to the anode through-hole conductor 12A. In this case, in addition to the core portion 52A, the porous layer 54A is also electrically connected to the anode through-hole conductor 12A.

The anode through-hole conductor 12A is formed, for example, as follows. First, the anode through-hole conductor 12A is subjected to a drilling process, a laser process, or the like in a part where the anode through-hole conductor 12A is to be formed, to form the anode through-hole 61. Then, the inner wall surface of the anode through-hole 61 is metallized with a low-resistance metal such as copper, gold, or silver to form the anode through-hole conductor 12A. When forming the anode through-hole conductor 12A, for example, the inner wall surface of the anode through-hole 61 is metallized by an electrolytic copper plating treatment, an electroless copper plating treatment, or the like, and thus the processing is facilitated. It should be noted that, as a method of forming the anode through-hole conductor 12A, a method of filling the anode through-hole 61 with a metal, a composite material of a metal and a resin, or the like may be used in addition to the method of metallizing the inner wall surface of the anode through-hole 61.

As shown in FIG. 6, according to an exemplary aspect, the module 10A further includes an anode connection layer 70 provided between the anode through-hole conductor 12A and an end surface of the anode plate 51A. In the example shown in FIG. 6, the anode connection layer 70 is in contact with both the anode through-hole conductor 12A and the end surface of the anode plate 51A.

Since the anode connection layer 70 is provided between the anode through-hole conductor 12A and the end surface of the anode plate 51A, the anode connection layer 70 functions as a barrier layer with respect to the anode plate 51A, in an exemplary embodiment, as a barrier layer with respect to the core portion 52A and the porous layer 54A. By using the anode connection layer 70, the dissolution of the end surface of the anode plate 51A generated during the chemical liquid treatment for forming the first anode connection terminal layer 13Aa, the second anode connection terminal layer 14Aa, and the like is suppressed, and thus the immersion of the chemical liquid into the capacitor portion C1 is suppressed. Therefore, the reliability of the capacitor portion C1 is easily improved, and thus the reliability of the module 10A is easily improved.

As shown in FIG. 6, according to an exemplary aspect, the anode through-hole conductor 12A and the end surface of the anode plate 51A are electrically connected to each other with the anode connection layer 70 interposed therebetween.

As shown in FIG. 6, the anode connection layer 70 may include a first anode connection layer 70A and a second anode connection layer 70B in this order from the end surface side of the anode plate 51A.

In the anode connection layer 70, for example, the first anode connection layer 70A may be a layer containing zinc as a main component, and the second anode connection layer 70B may be a layer containing nickel or copper as a main component. In this case, the first anode connection layer 70A is formed on the end surface of the anode plate 51A, for example, by substituting and depositing zinc by a zincate treatment, and then the second anode connection layer 70B is formed on the surface of the first anode connection layer 70A, for example, by an electroless nickel plating treatment or an electroless copper plating treatment. In addition, the first anode connection layer 70A may disappear during the formation of the second anode connection layer 70B. In this case, the anode connection layer 70 may consist of only the second anode connection layer 70B.

The anode connection layer 70 includes a layer containing nickel as a main component. In this case, since the damage to the metal (for example, aluminum) configuring the anode plate 51A is reduced, the barrier properties of the anode connection layer 70 with respect to the anode plate 51A are easily improved.

As shown in FIG. 6, in the thickness direction T, the dimensions of the anode connection layer 70 are larger than the dimensions of the anode plate 51A. In this case, since the entire end surface of the anode plate 51A is covered with the anode connection layer 70, the barrier properties of the anode connection layer 70 with respect to the anode plate 51A are easily improved.

In the thickness direction T, the dimension of the anode connection layer 70 is more than 100% and 200% or less of the dimension of the anode plate 51A.

In the thickness direction T, the dimensions of the anode connection layer 70 may be the same as the dimensions of the anode plate 51A or smaller than the dimensions of the anode plate 51A.

In addition, the anode connection layer 70 is not necessarily provided between the anode through-hole conductor 12A and the end surface of the anode plate 51A. In this case, the anode through-hole conductor 12A may be directly connected to the end surface of the anode plate 51A.

As shown in FIGS. 3, 4, and 5, according to an exemplary aspect, the anode through-hole conductor 12A is electrically connected to the end surface of the anode plate 51A over the entire circumference of the anode through-hole 61 when viewed in the thickness direction T. When the anode connection layer 70 is provided between the anode through-hole conductor 12A and the end surface of the anode plate 51A, the anode through-hole conductor 12A is connected to the anode connection layer 70 over the entire circumference of the anode through-hole 61 when viewed in the thickness direction T. In this case, since the contact area between the anode through-hole conductor 12A and the anode connection layer 70 is increased, the connection resistance between the anode through-hole conductor 12A and the anode connection layer 70 is likely to be reduced. As a result, since the connection resistance between the anode through-hole conductor 12A and the anode plate 51A is likely to be reduced, the equivalent series resistance (ESR) of the capacitor portion C1 is likely to be reduced. Further, since the close contact properties between the anode through-hole conductor 12A and the anode connection layer 70 are likely to be improved, the anode through-hole conductor 12A and the anode connection layer 70 are less likely to cause any abnormality such as peeling due to thermal stress.

The first anode connection terminal layer 13Aa and the second anode connection terminal layer 14Aa are electrically connected to the anode through-hole conductor 12A. In the example shown in FIG. 6, the first anode connection terminal layer 13Aa and the second anode connection terminal layer 14Aa are provided on the surface of the anode through-hole conductor 12A. The first anode connection terminal layer 13Aa and the second anode connection terminal layer 14Aa function as the connection terminals of the capacitor portion C1.

Examples of a constituent material for the first anode connection terminal layer 13Aa and the second anode connection terminal layer 14Aa include a low-resistance metal such as silver, gold, and copper. In this case, the first anode connection terminal layer 13Aa and the second anode connection terminal layer 14Aa are formed, for example, by performing a plating treatment on the surface of the anode through-hole conductor 12A.

In order to improve the close contact properties between the first anode connection terminal layer 13Aa and the other members, here, in order to improve the close contact properties between the first anode connection terminal layer 13Aa and the anode through-hole conductor 12A, as the constituent material for the first anode connection terminal layer 13Aa, a mixed material of at least one conductive filler selected from the group consisting of a silver filler, a copper filler, a nickel filler, and a carbon filler, and a resin may be used.

In order to improve the close contact properties between the second anode connection terminal layer 14Aa and the other members, here, in order to improve the close contact properties between the second anode connection terminal layer 14Aa and the anode through-hole conductor 12A, as the constituent material for the second anode connection terminal layer 14Aa, a mixed material of at least one conductive filler selected from the group consisting of a silver filler, a copper filler, a nickel filler, and a carbon filler, and a resin may be used.

The constituent material of the first anode connection terminal layer 13Aa and the constituent material of the second anode connection terminal layer 14Aa may be the same as or different from each other, but are the same as each other.

As shown in FIGS. 3 to 6, according to an exemplary aspect, the module 10A further includes a first resin-filled portion 71A in which the anode through-hole 61 is filled with the resin material. In the examples shown in FIGS. 3, 4, 5, and 6, the first resin-filled portion 71A is provided in a space surrounded by the anode through-hole conductor 12A on the inner wall surface of the anode through-hole 61. When the space in the anode through-hole 61 is eliminated by providing the first resin-filled portion 71A, the occurrence of the delamination of the anode through-hole conductor 12A is suppressed.

According to an exemplary aspect, a thermal expansion coefficient of the first resin-filled portion 71A is larger than a thermal expansion coefficient of the anode through-hole conductor 12A. In some exemplary embodiments, the thermal expansion coefficient of the resin material filled in the anode through-hole 61 is larger than the thermal expansion coefficient of the constituent material (for example, copper) of the anode through-hole conductor 12A. In this case, the resin material filled in the first resin-filled portion 71A, in an exemplary embodiment, the anode through-hole 61 expands in the high temperature environment. Accordingly, the anode through-hole conductor 12A is pressed against the inner wall surface of the anode through-hole 61 from the inside to the outer side portion of the anode through-hole 61, and thus the occurrence of the delamination of the anode through-hole conductor 12A is sufficiently suppressed.

The thermal expansion coefficient of the first resin-filled portion 71A may be the same as the thermal expansion coefficient of the anode through-hole conductor 12A or smaller than the thermal expansion coefficient of the anode through-hole conductor 12A. In an exemplary embodiment, the thermal expansion coefficient of the resin material filled in the anode through-hole 61 may be the same as the thermal expansion coefficient of the constituent material of the anode through-hole conductor 12A, or may be smaller than the thermal expansion coefficient of the constituent material of the anode through-hole conductor 12A.

The module 10A does not necessarily include the first resin-filled portion 71A. In this case, according to an exemplary aspect, the anode through-hole conductor 12A is provided not only on the inner wall surface of the anode through-hole 61 but also on the entire inside of the anode through-hole 61.

As shown in FIG. 6, according to an exemplary aspect, the module 10A further includes a first insulating layer 80A in which the porous layer 54A is filled with the insulating material. In this case, the insulating property between the anode plate 51A and the cathode layer 56A is ensured, and the short-circuit between the two is prevented.

As shown in FIG. 6, according to an exemplary aspect, the first insulating layer 80A is provided not only inside the porous layer 54A but also on the surface of the dielectric layer in the capacitor portion C1, on which the cathode layer 56A is not provided. In this case, the insulating property between the anode plate 51A and the cathode layer 56A is sufficiently ensured, and the short-circuit between the two is sufficiently prevented.

As shown in FIG. 6, according to an exemplary aspect, the first insulating layer 80A is provided around the anode through-hole conductor 12A. In this case, the insulating property between the anode plate 51A and the cathode layer 56A is sufficiently ensured, and the short-circuit between the two is sufficiently prevented. Further, since the first insulating layer 80A functions as a barrier layer with respect to the anode plate 51A, in an exemplary embodiment, as a barrier layer with respect to the core portion 52A and the porous layer 54A, the dissolution of the end surface of the anode plate 51A generated during the chemical liquid treatment for forming the first anode connection terminal layer 13Aa, the second anode connection terminal layer 14Aa, and the like is suppressed, and thus the immersion of the chemical liquid in the capacitor portion C1 is suppressed. Therefore, the reliability of the capacitor portion C1 is easily improved, and thus the reliability of the module 10A is easily improved.

From the viewpoint of further enhancing the above-described effects, as shown in FIG. 6, according to an exemplary aspect, the dimension of the first insulating layer 80A in the thickness direction T is larger than the dimension of the porous layer 54A.

Examples of a constituent material for the first insulating layer 80A include a resin material such as epoxy, phenol, and polyimide, and a mixed material of a resin material such as epoxy, phenol, and polyimide and an inorganic filler such as silica and alumina.

As shown in FIG. 6, according to an exemplary aspect, the module 10A further includes an insulating portion 81 provided on the surface of the capacitor portion C1.

As shown in FIG. 6, the insulating portion 81 preferably includes a first insulating portion 81A provided on the surface of the capacitor portion C1 and a second insulating portion 81B provided on the surface of the first insulating portion 81A.

Examples of a constituent material for the first insulating portion 81A and the second insulating portion 81B include a resin material such as epoxy, phenol, and polyimide, and a mixed material of a resin material such as epoxy, phenol, and polyimide and an inorganic filler such as silica and alumina.

The constituent material of the first insulating portion 81A and the constituent material of the second insulating portion 81B may be the same as or different from each other.

Figure 7:
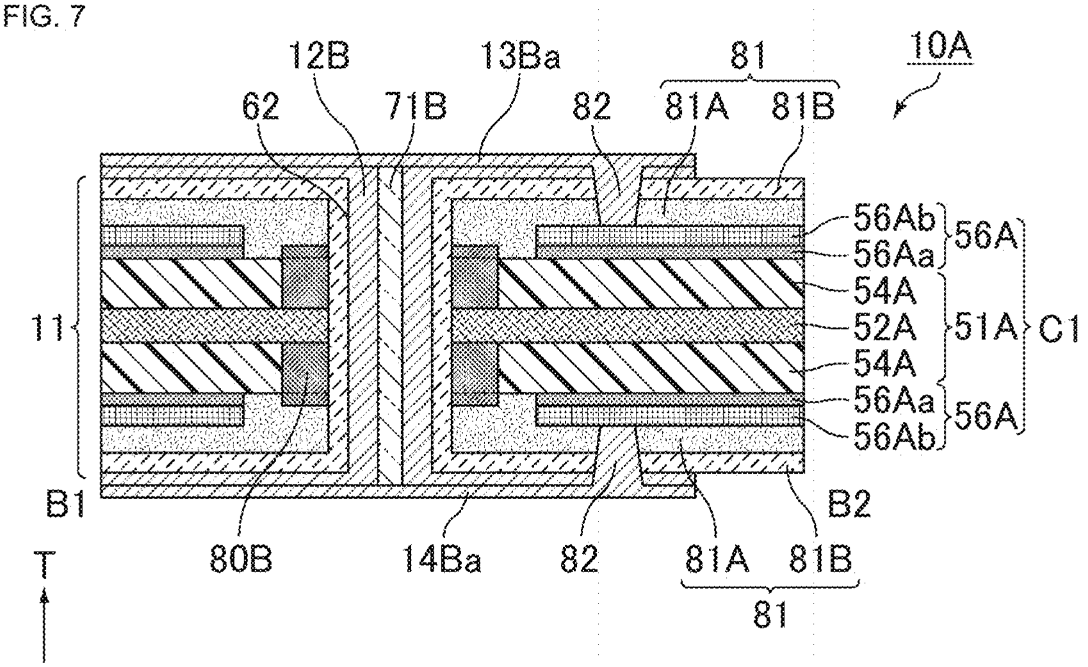
FIG. 7 is a schematic cross-sectional view showing an example of a cross section taken along a line segment B1-B2 of the module shown in FIGS. 3 and 5.

FIG. 7 is a schematic cross-sectional view showing an example of a cross section taken along a line segment B1-B2 of the module shown in FIGS. 3 and 5.

In the module 10A shown in FIG. 7, the cathode through-hole conductor 12B is provided to penetrate the capacitor portion C1 in the thickness direction T of the capacitor layer 11. In the example shown in FIG. 7, the cathode through-hole conductor 12B is provided on at least the inner wall surface of the cathode through-hole 62 penetrating the capacitor portion C1 in the thickness direction T, and is electrically connected to the cathode layer 56A.

Here, in the example shown in FIG. 7, as an aspect in which the first cathode connection terminal layer 13Ba is electrically connected to the cathode through-hole conductor 12B, the first cathode connection terminal layer 13Ba is provided on the surface of the cathode through-hole conductor 12B and functions as a connection terminal of the capacitor portion C1. In addition, in the example shown in FIG. 7, the via conductor 82 is provided to penetrate the insulating portion 81 in the thickness direction T and to be connected to the first cathode connection terminal layer 13Ba and the cathode layer 56A. That is, the first cathode connection terminal layer 13Ba is electrically connected to the cathode layer 56A with the via conductor 82 interposed therebetween. Therefore, in the example shown in FIG. 7, the cathode through-hole conductor 12B is electrically connected to the cathode layer 56A with the first cathode connection terminal layer 13Ba and the via conductor 82 interposed therebetween In addition, in the example shown in FIG. 7, as an aspect in which the second cathode connection terminal layer 14Ba is electrically connected to the cathode through-hole conductor 12B, the second cathode connection terminal layer 14Ba is provided on the surface of the cathode through-hole conductor 12B and functions as a connection terminal of the capacitor portion C1. In addition, in the example shown in FIG. 7, the via conductor 82 is provided to penetrate the insulating portion 81 in the thickness direction T and to be connected to the second cathode connection terminal layer 14Ba and the cathode layer 56A. That is, the second cathode connection terminal layer 14Ba is electrically connected to the cathode layer 56A with the via conductor 82 interposed therebetween. Therefore, in the example shown in FIG. 7, the cathode through-hole conductor 12B is electrically connected to the cathode layer 56A with the second cathode connection terminal layer 14Ba and the via conductor 82 interposed therebetween.

As described above, when the cathode through-hole conductor 12B is electrically connected to the cathode layer 56A, the size of the module 10A can be reduced.

The cathode through-hole conductor 12B is formed, for example, as follows. First, a through-hole is formed by performing a drilling process, a laser process, or the like on a part where the cathode through-hole conductor 12B is to be formed. Next, the insulating layer is formed by filling the formed through-hole with a constituent material (for example, a resin material) of the second insulating portion 81B. Then, the cathode through-hole 62 is formed by performing a drilling process, a laser process, or the like on the formed insulating layer. In this case, the diameter of the cathode through-hole 62 is made smaller than the diameter of the insulating layer, and accordingly, the constituent material of the second insulating portion 81B is placed between the previously formed through-hole and the cathode through-hole 62. Thereafter, the inner wall surface of the cathode through-hole 62 is metallized with a metal having low resistance, such as copper, gold, or silver, to form the cathode through-hole conductor 12B. When forming the cathode through-hole conductor 12B, for example, the inner wall surface of the cathode through-hole 62 is metallized by an electrolytic copper plating treatment, an electroless copper plating treatment, or the like, and thus the processing is facilitated. It should be noted that, as a method of forming the cathode through-hole conductor 12B, a method of filling the cathode through-hole 62 with a metal, a composite material of a metal and a resin, or the like may be used in addition to the method of metallizing the inner wall surface of the cathode through-hole 62.

Examples of a constituent material of the first cathode connection terminal layer 13Ba and the second cathode connection terminal layer 14Ba include a low-resistance metal such as silver, gold, and copper. In this case, the first cathode connection terminal layer 13Ba and the second cathode connection terminal layer 14Ba are formed, for example, by performing a plating treatment on the surface of the cathode through-hole conductor 12B.

In order to improve the close contact properties between the first cathode connection terminal layer 13Ba and the other members, here, in order to improve the close contact properties between the first cathode connection terminal layer 13Ba and the cathode through-hole conductor 12B, as the constituent material for the first cathode connection terminal layer 13Ba, a mixed material of at least one conductive filler selected from the group consisting of a silver filler, a copper filler, a nickel filler, and a carbon filler, and a resin may be used.

In order to improve the close contact properties between the second cathode connection terminal layer 14Ba and the other members, here, in order to improve the close contact properties between the second cathode connection terminal layer 14Ba and the cathode through-hole conductor 12B, as the constituent material for the second cathode connection terminal layer 14Ba, a mixed material of at least one conductive filler selected from the group consisting of a silver filler, a copper filler, a nickel filler, and a carbon filler, and a resin may be used.

The constituent material of the first cathode connection terminal layer 13Ba and the constituent material of the second cathode connection terminal layer 14Ba may be the same as or different from each other, but are preferably the same as each other.

Examples of a constituent material of the via conductor 82 include the same constituent materials as those of the first cathode connection terminal layer 13Ba and the second cathode connection terminal layer 14Ba.

The via conductor 82 is formed, for example, by performing a plating treatment on an inner wall surface with respect to a through-hole provided to penetrate the insulating portion 81 in the thickness direction T, or by filling the through-hole with a conductive paste and then performing a heat treatment.

As shown in FIGS. 3, 4, 5, and 7, according to an exemplary aspect, the module 10A further includes a second resin-filled portion 71B in which the cathode through-hole 62 is filled with the resin material. In the examples shown in FIGS. 3, 4, 5, and 7, the second resin-filled portion 71B is provided in a space surrounded by the cathode through-hole conductor 12B on the inner wall surface of the cathode through-hole 62. When the second resin-filled portion 71B is provided and the space in the cathode through-hole 62 is eliminated, the occurrence of the delamination of the cathode through-hole conductor 12B is suppressed.

According to an exemplary aspect, a thermal expansion coefficient of the second resin-filled portion 71B is larger than a thermal expansion coefficient of the cathode through-hole conductor 12B. In some exemplary embodiments, the thermal expansion coefficient of the resin material filled in the cathode through-hole 62 is larger than the thermal expansion coefficient of the constituent material (for example, copper) of the cathode through-hole conductor 12B. In this case, the second resin-filled portion 71B, in an exemplary embodiment, the resin material filled in the cathode through-hole 62 expands in the high temperature environment. Accordingly, the cathode through-hole conductor 12B is pressed against the inner wall surface of the cathode through-hole 62 from the inside to the outer side portion of the cathode through-hole 62, and thus the occurrence of the delamination of the cathode through-hole conductor 12B is sufficiently suppressed.

The thermal expansion coefficient of the second resin-filled portion 71B may be the same as the thermal expansion coefficient of the cathode through-hole conductor 12B or smaller than the thermal expansion coefficient of the cathode through-hole conductor 12B. In an exemplary embodiment, the thermal expansion coefficient of the resin material filled in the cathode through-hole 62 may be the same as the thermal expansion coefficient of the constituent material of the cathode through-hole conductor 12B, or may be smaller than the thermal expansion coefficient of the constituent material of the cathode through-hole conductor 12B.

The module 10A does not necessarily include the second resin-filled portion 71B. In this case, according to an exemplary aspect, the cathode through-hole conductor 12B is provided not only on the inner wall surface of the cathode through-hole 62 but also in the entire inside of the cathode through-hole 62.

As shown in FIG. 7, according to an exemplary aspect, the module 10A further includes a second insulating layer 80B in which the porous layer 54A is filled with the insulating material. In this case, the insulating property between the anode plate 51A and the cathode layer 56A is ensured, and the short-circuit between the two is prevented.

As shown in FIG. 7, according to an exemplary aspect, the second insulating layer 80B is provided not only inside the porous layer 54A but also on the surface of the dielectric layer on the surface of the capacitor portion C1, on which the cathode layer 56A is not provided. In this case, the insulating property between the anode plate 51A and the cathode layer 56A is sufficiently ensured, and the short-circuit between the two is sufficiently prevented.

As shown in FIG. 7, according to an exemplary aspect, the second insulating layer 80B is provided around the cathode through-hole conductor 12B. In this case, the insulating property between the anode plate 51A and the cathode layer 56A is sufficiently ensured, and the short-circuit between the two is sufficiently prevented. Further, since the second insulating layer 80B functions as a barrier layer with respect to the anode plate 51A, in an exemplary embodiment, as a barrier layer with respect to the core portion 52A and the porous layer 54A, the dissolution of the end surface of the anode plate 51A generated during the chemical liquid treatment for forming the first cathode connection terminal layer 13Ba, the second cathode connection terminal layer 14Ba, and the like is suppressed, and thus the immersion of the chemical liquid in the capacitor portion C1 is suppressed. Therefore, the reliability of the capacitor portion C1 is easily improved, and thus the reliability of the module 10A Is easily improved.

From the viewpoint of further enhancing the above-described effects, as shown in FIG. 7, according to an exemplary aspect, the dimension of the second insulating layer 80B in the thickness direction T is larger than the dimension of the porous layer 54A.

Examples of a constituent material for the second insulating layer 80B include a resin material such as epoxy, phenol, and polyimide, and a mixed material of a resin material such as epoxy, phenol, and polyimide and an inorganic filler such as silica and alumina.

When the module 10A includes the first insulating portion 81A and the second insulating portion 81B, as shown in FIG. 7, according to an exemplary aspect, the second insulating portion 81B extends between the anode plate 51A and the cathode through-hole conductor 12B. In the example shown in FIG. 7, the second insulating portion 81B is in contact with both the anode plate 51A and the cathode through-hole conductor 12B. Since the second insulating portion 81B extends between the anode plate 51A and the cathode through-hole conductor 12B, the insulating property between the anode plate 51A and the cathode through-hole conductor 12B, as well as the insulating property between the anode plate 51A and the cathode layer 56A is ensured, and the short-circuit between the two is prevented.

When the second insulating portion 81B extends between the anode plate 51A and the cathode through-hole conductor 12B, as shown in FIG. 7, according to an exemplary aspect, the core portion 52A and the porous layer 54A are exposed on the end surface of the anode plate 51A which is in contact with the second insulating portion 81B. In this case, since the contact area between the second insulating portion 81B and the porous layer 54A is increased, the close contact properties between the two are improved, and thus the abnormality such as peeling between the second insulating portion 81B and the porous layer 54A is less likely to occur.

When the core portion 52A and the porous layer 54A are exposed on the end surface of the anode plate 51A which is in contact with the second insulating portion 81B, as shown in FIG. 7, according to an exemplary aspect, the second insulating layer 80B that spreads inside the porous layer 54A by the entry of the insulating material into the void of the porous layer 54A is provided around the cathode through-hole conductor 12B. In this case, the insulating property between the anode plate 51A and the cathode through-hole conductor 12B, and thus the insulating property between the anode plate 51A and the cathode layer 56A is sufficiently ensured, and the short-circuit between the two is sufficiently prevented.

When the core portion 52A and the porous layer 54A are exposed on the end surface of the anode plate 51A which is in contact with the second insulating portion 81B, according to an exemplary aspect, the constituent material of the second insulating portion 81B enters the void of the porous layer 54A. In this case, the mechanical strength of the porous layer 54A is improved, and the occurrence of delamination due to the void of the porous layer 54A is suppressed.

According to an exemplary aspect, a thermal expansion coefficient of the second insulating portion 81B is larger than a thermal expansion coefficient of the cathode through-hole conductor 12B. In some exemplary embodiments, a thermal expansion coefficient of the constituent material of the second insulating portion 81B is larger than a thermal expansion coefficient of the constituent material (for example, copper) of the cathode through-hole conductor 12B. In this case, the second insulating portion 81B, in an exemplary embodiment, the constituent material of the second insulating portion 81B is expanded in a high temperature environment. Accordingly, the porous layer 54A and the cathode through-hole conductor 12B are suppressed, and thus the occurrence of delamination is sufficiently suppressed.

The thermal expansion coefficient of the second insulating portion 81B may be the same as the thermal expansion coefficient of the cathode through-hole conductor 12B or smaller than the thermal expansion coefficient of the cathode through-hole conductor 12B. In an exemplary embodiment, the thermal expansion coefficient of the constituent material of the second insulating portion 81B may be the same as the thermal expansion coefficient of the constituent material of the cathode through-hole conductor 12B or smaller than the thermal expansion coefficient of the constituent material of the cathode through-hole conductor 12B.

The module 10A may further include a through-hole conductor which is not electrically connected to the capacitor portion C1 when the through-hole conductor 12 used for the electrical connection between the capacitor portion C1 and at least one of the voltage regulator 20 or the load 30, for example, the anode through-hole conductor 12A and the cathode through-hole conductor 12B, which are electrically connected to the capacitor portion C1, are provided.

Examples of the through-hole conductor which is not electrically connected to the capacitor portion C1 include a through-hole conductor for an I/O line. An insulating material is filled between the through-hole conductor for an I/O line and the through-hole which is provided with the through-hole conductor and penetrates the capacitor portion C1 in the thickness direction.

Since the module 10A includes, for example, a through-hole conductor for an I/O line as the through-hole conductor which is not electrically connected to the capacitor portion C1, and accordingly, the design freedom degree of the semiconductor composite device 1A can be improved and the size of the semiconductor composite device 1A can be reduced.

In the module of the present disclosure, according to an exemplary aspect, the area of the capacitor layer when viewed in the thickness direction is 200 $mm^2$ or more.

In the module 10A, the area of the capacitor layer 11 when viewed in the thickness direction T is preferably 200 $mm^2$ or more. In this case, the large-capacitance of the capacitor portion C1 is easily realized. On the other hand, as described above, in the module in the related art, there is a problem that warping and delamination occur during the heat treatment. However, as a result of the studies by the present inventor, it has been found that the warping and the delamination occurring during the heat treatment are particularly remarkable when the area of the capacitor layer is large. On the other hand, in the module 10A, even when the area of the capacitor layer 11 is 200 $mm^2$ or more, the occurrence of warping and delamination during the heat treatment is suppressed.

The area of the capacitor layer 11 when viewed in the thickness direction T is preferably 4000 $mm^2$ or less.

The area of the capacitor layer when viewed in the thickness direction is measured by using image analysis software or by actually measuring on an image with respect to the captured planar image of the capacitor layer.

In the module according to the present disclosure, the dimension of the capacitor layer in the thickness direction is preferably 300 μm or less.

In the module 10A, a dimension of the capacitor layer 11 in the thickness direction T is preferably 300 μm or less. In this case, the large-capacitance of the capacitor portion C1 is easily realized. On the other hand, as described above, in the module in the related art, there is a problem that warping and delamination occur during the heat treatment. However, as a result of the study by the present inventor, it has been found that the warping and the delamination occurring during the heat treatment are particularly remarkable not only when the area of the capacitor layer is large, but also when the dimension of the capacitor layer in the thickness direction is small. On the other hand, in the module 10A, the occurrence of warping and delamination during the heat treatment is suppressed even in when the dimension of the capacitor layer 11 in the thickness direction T is 300 μm or less.

The dimension of the capacitor layer 11 in the thickness direction T is preferably 100 μm or more.

The dimension of the capacitor layer in the thickness direction is measured by using image analysis software or by actually measuring on an image after the cross section along the thickness direction is exposed by polishing the module.

In the module according to the present disclosure, according to an exemplary aspect, the dimension of the capacitor layer in the thickness direction is 1/10 or less of a minimum dimension in a direction orthogonal to the thickness direction.

In the module 10A, according to an exemplary aspect, the dimension of the capacitor layer 11 in the thickness direction T is 1/10 or less of the minimum dimension in the direction orthogonal to the thickness direction T. In this case, the large-capacitance of the capacitor portion C1 is easily realized. In the module 10A, even when the dimension of the capacitor layer 11 in the thickness direction T is small as described above, the occurrence of warping and delamination during the heat treatment is suppressed.

According to an exemplary aspect, the dimension of the capacitor layer 11 in the thickness direction T is 1/1000 or more of the minimum dimension in the direction orthogonal to the thickness direction T.

The minimum dimension in the direction orthogonal to the thickness direction in the capacitor layer is measured by using image analysis software or by actually measuring on an image with respect to a captured planar image of the capacitor layer.

In the semiconductor composite device according to the present disclosure, according to an exemplary aspect, when viewed in the thickness direction, the area of the capacitor layer is larger than the area of the load.

Figure 8:
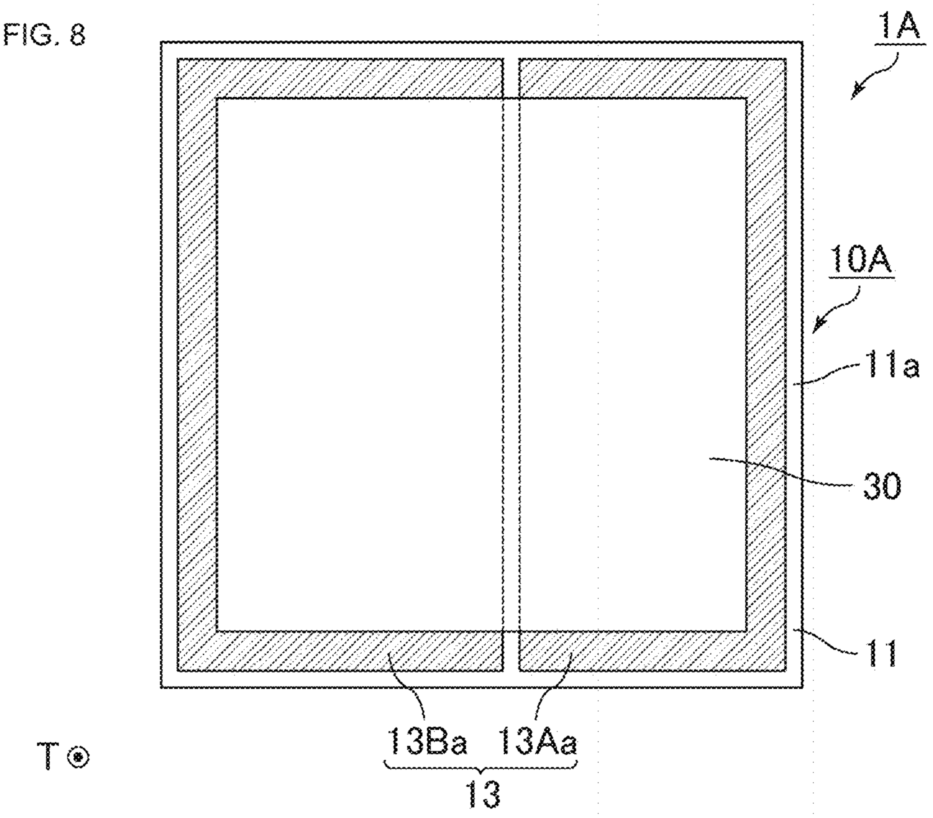
FIG. 8 is a schematic plan view showing an example of a state where the module and a load in the semiconductor composite device shown in FIG. 2 are viewed from a load side.

FIG. 8 is a schematic plan view showing an example of a state where the module and the load in the semiconductor composite device shown in FIG. 2 are viewed from the load side.

As shown in FIG. 8, according to an exemplary aspect, the area of the capacitor layer 11 is larger than the area of the load 30 when viewed in the thickness direction T. In this case, the large-capacitance of the capacitor portion C1 is easily realized. In the module 10A, even when the area of the capacitor layer 11 is large as described above, the occurrence of warping and delamination during the heat treatment is suppressed.

The area of the load when viewed in the thickness direction is measured by using image analysis software or by actually measuring on an image with respect to the captured planar image of the load.

Embodiment 2

In the module of Embodiment 2 of the present disclosure, unlike the module of Embodiment 1 of the present disclosure, the capacitor layer has a plurality of the capacitor portions.

Figure 9:
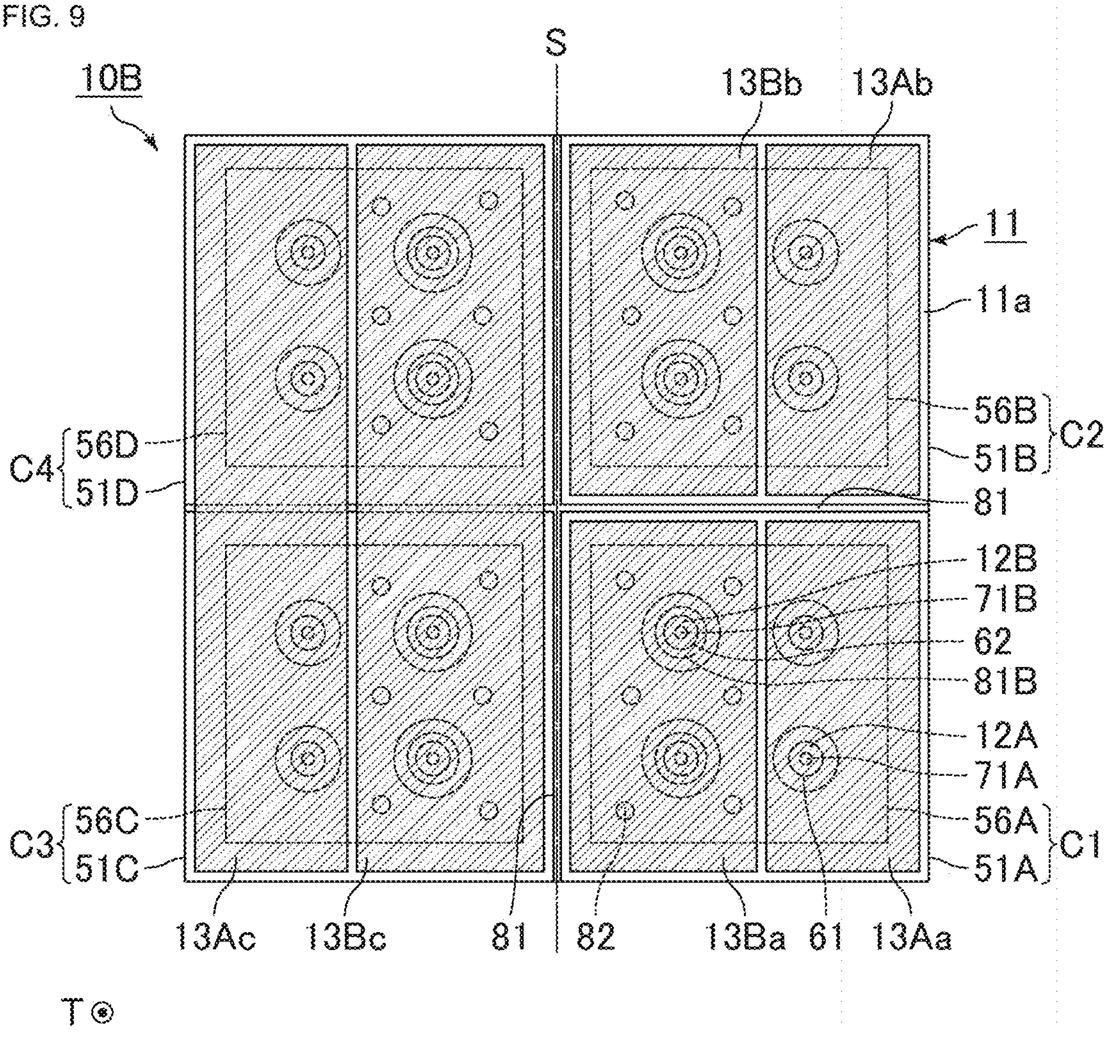
FIG. 9 is a schematic plan view showing an example of a state where a module according to Embodiment 2 of the present disclosure is viewed from one main surface side.
Figure 10:
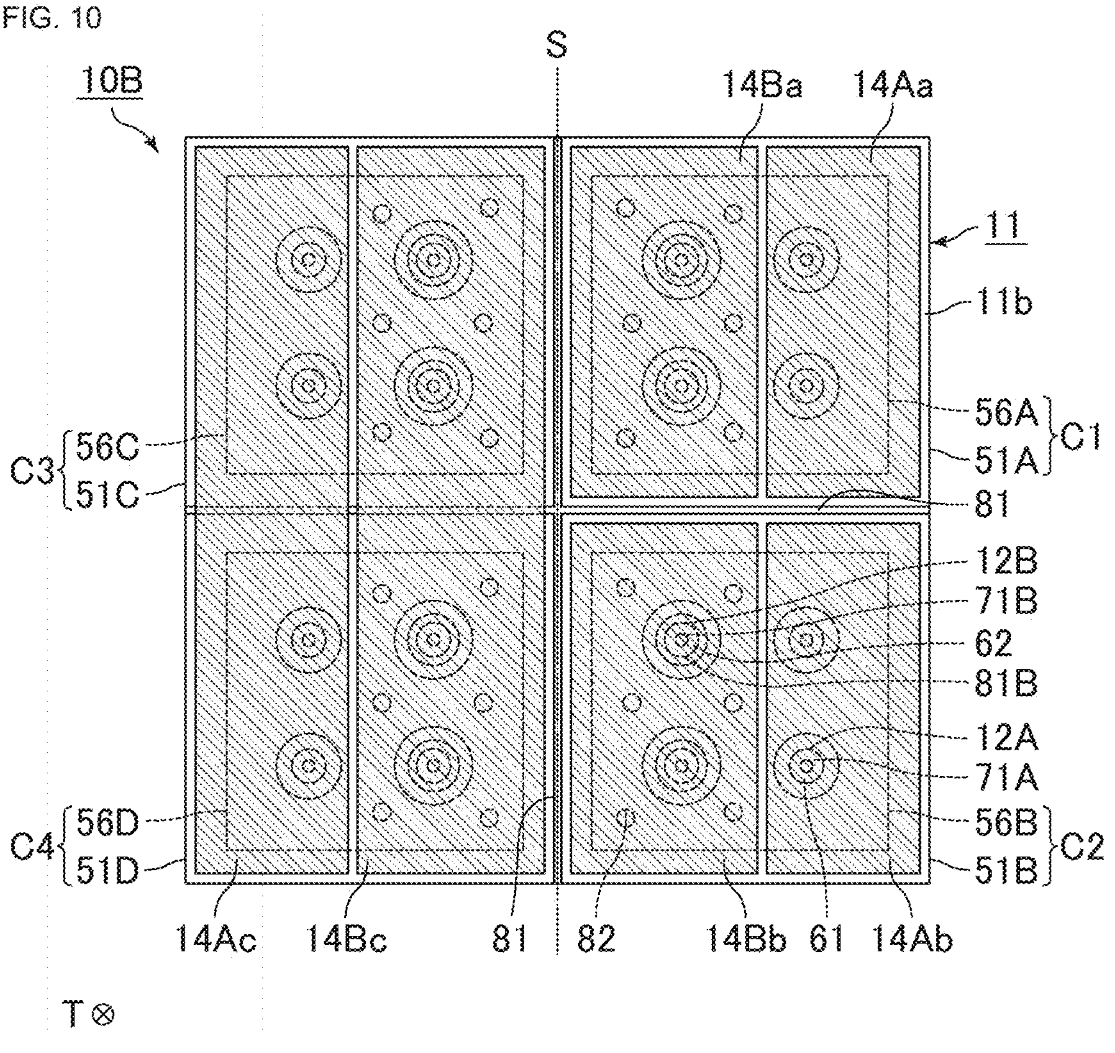
FIG. 10 is a schematic plan view showing an example of a state where the module according to Embodiment 2 of the present disclosure is viewed from the other main surface side.

FIG. 9 is a schematic plan view showing an example of a state where the module according to Embodiment 2 of the present disclosure is viewed from one main surface side. FIG. 10 is a schematic plan view showing an example of a state where the module according to Embodiment 2 of the present disclosure is viewed from the other main surface side.

In the module 10B shown in FIGS. 9 and 10, the capacitor layer 11 includes the capacitor portion C1, a capacitor portion C2, a capacitor portion C3, and a capacitor portion C4.

The capacitor portion C1 includes the anode plate 51A, a dielectric layer (not shown), and the cathode layer 56A.

The capacitor portion C2 includes an anode plate 51B, a dielectric layer (not shown), and a cathode layer 56B.

The capacitor portion C3 includes an anode plate 51C, a dielectric layer (not shown), and a cathode layer 56C.

The capacitor portion C4 includes an anode plate 51D, a dielectric layer (not shown), and a cathode layer 56D.

The cross-sectional structures of the capacitor portion C2, the capacitor portion C3, and the capacitor portion C4 are the same as the cross-sectional structure of the capacitor portion C1 shown in FIGS. 6 and 7.

The through-hole conductors provided to penetrate each of the capacitor portion C2, the capacitor portion C3, and the capacitor portion C4 in the thickness direction T are the same as the anode through-hole conductor 12A and the cathode through-hole conductor 12B, which are provided to penetrate the capacitor portion C1 in the thickness direction T.

In the module according to the present disclosure, the capacitor layer may have a plurality of the capacitor portions that are disposed in a plane.

In the module 10B shown in FIGS. 9 and 10, in the capacitor layer 11, the capacitor portion C1, the capacitor portion C2, the capacitor portion C3, and the capacitor portion C4 are disposed in a plane.

When the capacitor layer 11 has a plurality of capacitor portions, the number of capacitor portions is not limited to four shown in FIGS. 9 and 10, and may be two, three, or five or more.

When the capacitor layer 11 has a plurality of capacitor portions, according to an exemplary aspect, the plurality of capacitor portions are divided by the plurality of through portions and are disposed in a plane. In the example shown in FIGS. 9 and 10, the capacitor portion C1, the capacitor portion C2, the capacitor portion C3, and the capacitor portion C4 are divided by the through portions extending in two directions (in FIGS. 9 and 10, the up-down direction and the left-right direction) orthogonal to the thickness direction T and are disposed in a plane, and the insulating portion 81 extends inside the through portions.

When the capacitor layer 11 has a plurality of capacitor portions, the plurality of capacitor portions may be regularly disposed or irregularly disposed. In the examples shown in FIGS. 9 and 10, the capacitor portion C1, the capacitor portion C2, the capacitor portion C3, and the capacitor portion C4 are regularly disposed.

When the capacitor layer 11 has a plurality of capacitor portions, areas of the plurality of capacitor portions may be the same as or different from each other, or may be partially different from each other. In the examples shown in FIGS. 9 and 10, the areas of the capacitor portion C1, the capacitor portion C2, the capacitor portion C3, and the capacitor portion C4 are the same as each other.

When the capacitor layer 11 has a plurality of capacitor portions, the planar shapes of the plurality of capacitor portions may be the same as or different from each other, or may be partially different from each other. In the examples shown in FIGS. 9 and 10, the planar shapes of the capacitor portion C1, the capacitor portion C2, the capacitor portion C3, and the capacitor portion C4 are the same as each other.

When the capacitor layer 11 includes a plurality of capacitor portions, the plurality of capacitor portions may include only the capacitor portions having a rectangular planar shape, may include only the capacitor portions having a non-rectangular planar shape, or may include both the capacitor portions having a rectangular planar shape and the capacitor portions having a non-rectangular planar shape. Examples of the capacitor portion having a planar shape which is not a rectangular shape include a capacitor portion having a planar shape of a quadrangle other than the rectangular shape, a polygonal shape such as a triangle, a pentagon, and a hexagon, a shape including a curved portion, a circular shape, and an elliptical shape.

In the module according to the present disclosure, the capacitor layer may have a plurality of the above-described capacitor portions obtained by dividing one capacitor sheet.

In the module 10B shown in FIGS. 9 and 10, the capacitor layer 11 may have a plurality of capacitor portions obtained by dividing one capacitor sheet. In the examples shown in FIGS. 9 and 10, the capacitor portion C1, the capacitor portion C2, the capacitor portion C3, and the capacitor portion C4 may be divided from one capacitor sheet. In this case, since the freedom degree for the arrangement of the capacitor portion C1, the capacitor portion C2, the capacitor portion C3, and the capacitor portion C4 is improved, a higher effect is obtained in the reduction of the size of the module 10B and thus the reduction of the size of the semiconductor composite device including the module 10B.

When a plurality of capacitor portions are formed by dividing one capacitor sheet in the manufacturing process of the module, for example, after each capacitor portion is formed, various wiring layers such as a through-hole conductor and a connection terminal layer are built up to form the module, and thus it is difficult to integrate the thermal characteristics of each capacitor portion and the various wiring layers. On the other hand, in the module 10B, even when the capacitor portion C1, the capacitor portion C2, the capacitor portion C3, and the capacitor portion C4 are divided from one capacitor sheet, the occurrence of warping and delamination during the heat treatment is suppressed.

When the capacitor portion C1, the capacitor portion C2, the capacitor portion C3, and the capacitor portion C4 in the module 10B are divided from one capacitor sheet, the anode plate 51A, the anode plate 51B, the anode plate 51C, and the anode plate 51D may be divided from one anode plate.

In the module 10B shown in FIG. 9, on the first main surface 11*a* side of the capacitor layer 11, the first anode connection terminal layer 13Aa, a first anode connection terminal layer 13Ab, and a first anode connection terminal layer 13Ac are provided.

The first anode connection terminal layer 13Aa is electrically connected to the anode plate 51A of the capacitor portion C1.

The first anode connection terminal layer 13Ab is electrically connected to the anode plate 51B of the capacitor portion C2.

The first anode connection terminal layer 13Ac is electrically connected to the anode plate 51C of the capacitor portion C3 and the anode plate 51D of the capacitor portion C4.

In the module 10B shown in FIG. 9, the first cathode connection terminal layer 13Ba, a first cathode connection terminal layer 13Bb, and a first cathode connection terminal layer 13Bc are provided on the first main surface 11*a* side of the capacitor layer 11.

The first cathode connection terminal layer 13Ba is electrically connected to the cathode layer 56A of the capacitor portion C1 with a via conductor 82 interposed therebetween.

The first cathode connection terminal layer 13Bb is electrically connected to the cathode layer 56B of the capacitor portion C2 with the via conductor 82 interposed therebetween.

The first cathode connection terminal layer 13Bc is electrically connected to the cathode layer 56C of the capacitor portion C3 and the cathode layer 56D of the capacitor portion C4 with the via conductor 82 interposed therebetween.

In the module 10B shown in FIG. 9, when viewed in the thickness direction T, the entirety of the first anode connection terminal layer 13Aa and the first cathode connection terminal layer 13Ba and the entirety of the entire cathode layer 56A overlap each other in terms of area by 90% or more with the area of the entirety of the cathode layer 56A as a reference. Similarly, in the module 10B, when viewed in the thickness direction T, the entirety of the first anode connection terminal layer 13Ab and the first cathode connection terminal layer 13Bb and the entirety of the entire cathode layer 56B overlap each other in terms of area by 90% or more with the area of the entirety of the cathode layer 56B as a reference. In addition, in the module 10B, when viewed in the thickness direction T, the entirety of the first anode connection terminal layer 13Ac and the first cathode connection terminal layer 13Bc and the entirety of the entire cathode layer 56C overlap each other in terms of area by 90% or more with the area of the entirety of the cathode layer 56C as a reference. Further, in the module 10B, when viewed in the thickness direction T, the entirety of the first anode connection terminal layer 13Ac and the first cathode connection terminal layer 13Bc and the entirety of the entire cathode layer 56D overlap each other in terms of area by 90% or more with the area of the entirety of the cathode layer 56D as a reference.

In the module 10B shown in FIG. 10, on the second main surface 11*b* side of the capacitor layer 11, the second anode connection terminal layer 14Aa, a second anode connection terminal layer 14Ab, and a second anode connection terminal layer 14Ac are provided.

The second anode connection terminal layer 14Aa is electrically connected to the anode plate 51A of the capacitor portion C1.

The second anode connection terminal layer 14Ab is electrically connected to the anode plate 51B of the capacitor portion C2.

The second anode connection terminal layer 14Ac is electrically connected to the anode plate 51C of the capacitor portion C3 and the anode plate 51D of the capacitor portion C4.

In the module 10B shown in FIG. 10, the second cathode connection terminal layer 14Ba, a second cathode connection terminal layer 14Bb, and a second cathode connection terminal layer 14Bc are provided on the second main surface 11*b* side of the capacitor layer 11.

The second cathode connection terminal layer 14Ba is electrically connected to the cathode layer 56A of the capacitor portion C1 with the via conductor 82 interposed therebetween.

The second cathode connection terminal layer 14Bb is electrically connected to the cathode layer 56B of the capacitor portion C2 with the via conductor 82 interposed therebetween.

The second cathode connection terminal layer 14Bc is electrically connected to the cathode layer 56C of the capacitor portion C3 and the cathode layer 56D of the capacitor portion C4 with the via conductor 82 interposed therebetween.

In the module 10B shown in FIG. 10, when viewed in the thickness direction T, the entirety of the second anode connection terminal layer 14Aa and the second cathode connection terminal layer 14Ba and the entirety of the entire cathode layer 56A overlap each other in terms of area by 90% or more with the area of the entirety of the cathode layer 56A as a reference. Similarly, in the module 10B, when viewed in the thickness direction T, the entirety of the second anode connection terminal layer 14Ab and the second cathode connection terminal layer 14Bb and the entirety of the entire cathode layer 56B overlap each other in terms of area by 90% or more with the area of the entirety of the cathode layer 56B as a reference. In addition, in the module 10B, when viewed in the thickness direction T, the entirety of the second anode connection terminal layer 14Ac and the second cathode connection terminal layer 14Bc and the entirety of the entire cathode layer 56C overlap each other in terms of area by 90% or more with the area of the entirety of the cathode layer 56C as a reference. Further, in the module 10B, when viewed in the thickness direction T, the entirety of the second anode connection terminal layer 14Ac and the second cathode connection terminal layer 14Bc and the entirety of the entire cathode layer 56D overlap each other in terms of area by 90% or more with the area of the entirety of the cathode layer 56D as a reference.

As described above, in the module 10B, the entirety of the first anode connection terminal layer and the first cathode connection terminal layer and the entirety of the cathode layer overlap each other in terms of area by 90% or more with the area of the entirety of the cathode layer as a reference when viewed in the thickness direction T, and the entirety of the second anode connection terminal layer and the second cathode connection terminal layer and the entirety of the cathode layer overlap each other in terms of area by 90% or more with the area of the entirety of the cathode layer as a reference when viewed in the thickness direction T. Accordingly, as in the module 10A, the occurrence of warping and delamination during the heat treatment is suppressed. Further, in the module 10B, since the occurrence of warping and delamination during the heat treatment is suppressed, the stress caused by the warping and delamination is relaxed as in the module 10A, and thus, in particular, an interface or the like of a member formed of different materials is less likely to be damaged during the heat treatment.

As in the module 10B, when a plurality of sets of the first anode connection terminal layer, the second anode connection terminal layer, the first cathode connection terminal layer, and the second cathode connection terminal layer, which are electrically connected to the same capacitor portion, are present, in the example shown in FIGS. 9 and 10, for all of these sets, the entirety of the first anode connection terminal layer and the first cathode connection terminal layer and the entirety of the cathode layer overlap each other in terms of area by 90% or more with the area of the entirety of the cathode layer as a reference when viewed in the thickness direction T, and the entirety of the second anode connection terminal layer and the second cathode connection terminal layer and the entirety of the cathode layer overlap each other in terms of area by 90% or more with the area of the entirety of the cathode layer as a reference when viewed in the thickness direction T.

In addition, as in the module 10B, when a plurality of sets of the first anode connection terminal layer, the second anode connection terminal layer, the first cathode connection terminal layer, and the second cathode connection terminal layer, which are electrically connected to the same capacitor portion, are present, for at least one set of the plurality of sets, the entirety of the first anode connection terminal layer and the first cathode connection terminal layer and the entirety of the cathode layer may overlap each other in terms of area by 90% or more with the area of the entirety of the cathode layer as a reference when viewed in the thickness direction T, and the entirety of the second anode connection terminal layer and the second cathode connection terminal layer and the entirety of the cathode layer may overlap each other in terms of area by 90% or more with the area of the entirety of the cathode layer as a reference when viewed in the thickness direction T.

In the module 10B, when viewed in the thickness direction T, according to an exemplary aspect, the entirety of the first anode connection terminal layer 13Aa and the first cathode connection terminal layer 13Ba and the entirety of the second anode connection terminal layer 14Aa and the second cathode connection terminal layer 14Ba overlap each other in terms of area by 95% or more with a smaller area of the area of the entirety of the first anode connection terminal layer 13Aa and the first cathode connection terminal layer 13Ba and the area of the entirety of the second anode connection terminal layer 14Aa and the second cathode connection terminal layer 14Ba as a reference. Similarly, in the module 10B, when viewed in the thickness direction T, according to an exemplary aspect, the entirety of the first anode connection terminal layer 13Ab and the first cathode connection terminal layer 13Bb and the entirety of the second anode connection terminal layer 14Ab and the second cathode connection terminal layer 14Bb overlap each other in terms of area by 95% or more with a smaller area of the area of the entirety of the first anode connection terminal layer 13Ab and the first cathode connection terminal layer 13Bb and the area of the entirety of the second anode connection terminal layer 14Ab and the second cathode connection terminal layer 14Bb as a reference. Further, in the module 10B, when viewed in the thickness direction T, according to an exemplary aspect, the entirety of the first anode connection terminal layer 13Ac and the first cathode connection terminal layer 13Bc and the entirety of the second anode connection terminal layer 14Ac and the second cathode connection terminal layer 14Bc overlap each other in terms of area by 95% or more with a smaller area of the area of the entirety of the first anode connection terminal layer 13Ac and the first cathode connection terminal layer 13Bc and the area of the entirety of the second anode connection terminal layer 14Ac and the second cathode connection terminal layer 14Bc as a reference.

As in the module 10B, when a plurality of sets of the first anode connection terminal layer, the second anode connection terminal layer, the first cathode connection terminal layer, and the second cathode connection terminal layer, which are electrically connected to the same capacitor portion, are present, in the example shown in FIGS. 9 and 10, for all of these sets, when viewed in the thickness direction T, the entirety of the first anode connection terminal layer and the first cathode connection terminal layer and the entirety of the second anode connection terminal layer and the second cathode connection terminal layer overlap each other in terms of area by 95% or more with a smaller area of the area of the entirety of the first anode connection terminal layer and the first cathode connection terminal layer and the area of the entirety of the second anode connection terminal layer and the second cathode connection terminal layer as a reference.

In addition, as in the module 10B, when a plurality of sets of the first anode connection terminal layer, the second anode connection terminal layer, the first cathode connection terminal layer, and the second cathode connection terminal layer, which are electrically connected to the same capacitor portion, are present, according to an exemplary aspect, for at least one set of the plurality of sets, when viewed in the thickness direction T, the entirety of the first anode connection terminal layer and the first cathode connection terminal layer and the entirety of the second anode connection terminal layer and the second cathode connection terminal layer overlap each other in terms of area by 95% or more with a smaller area of the area of the entirety of the first anode connection terminal layer and the first cathode connection terminal layer and the area of the entirety of the second anode connection terminal layer and the second cathode connection terminal layer as a reference.

In the module according to the present disclosure, according to an exemplary aspect, the connection terminal layer includes a plurality of first connection terminal layers provided on the first main surface side of the capacitor layer and including the first anode connection terminal layer and the first cathode connection terminal layer; and a plurality of second connection terminal layers provided on the second main surface side of the capacitor layer and including the second anode connection terminal layer and the second cathode connection terminal layer, and when viewed in the thickness direction, when a reference line that passes through a center of the capacitor layer and extends in a direction orthogonal to the thickness direction is defined, the plurality of first connection terminal layers overlap each other in terms of area by 95% or more when inverted with respect to the reference line with a smaller area among areas of the first connection terminal layer in each of two regions divided by the reference line as a reference, and the plurality of second connection terminal layers overlap each other in terms of area by 95% or more when inverted with respect to the reference line with a smaller area among areas of the second connection terminal layer in each of two regions divided by the reference line as a reference.

In the module 10B shown in FIG. 9, on the first main surface 11*a* side of the capacitor layer 11, the first anode connection terminal layer 13Aa and the first cathode connection terminal layer 13Ba corresponding to the capacitor portion C1, the first anode connection terminal layer 13Ab and the first cathode connection terminal layer 13Bb corresponding to the capacitor portion C2, and the first anode connection terminal layer 13Ac and the first cathode connection terminal layer 13Bc corresponding to the capacitor portion C3 are provided as a plurality of first connection terminal layers.

In the module 10B shown in FIG. 9, when viewed in the thickness direction T, when a reference line S passing through the center of the capacitor layer 11 and extending in the direction (in FIG. 9, the up-down direction) orthogonal to the thickness direction T is defined, according to an exemplary aspect, the plurality of first connection terminal layers overlap each other in terms of area by 95% or more when inverted with respect to the reference line S with a smaller area among areas of the first connection terminal layer in each of two regions divided by the reference line S as a reference.

That is, in the module 10B, the plurality of first connection terminal layers are divided into two regions, that is, a region (in FIG. 9, the right region) where the first anode connection terminal layer 13Aa, the first cathode connection terminal layer 13Ba, the first anode connection terminal layer 13Ab, and the first cathode connection terminal layer 13Bb are disposed by the reference line S, and a region (in FIG. 9, the left region) where the first anode connection terminal layer 13Ac and the first cathode connection terminal layer 13Bc are disposed. In addition, in each of the two regions, according to an exemplary aspect, the plurality of first connection terminal layers overlap each other in terms of area by 95% or more when inverted with respect to the reference line S with a smaller area among areas of the first connection terminal layer in each of the two regions, that is, a smaller area of the total area of the first anode connection terminal layer 13Aa, the first cathode connection terminal layer 13Ba, the first anode connection terminal layer 13Ab, and the first cathode connection terminal layer 13Bb and the total area of the first anode connection terminal layer 13Ac and the first cathode connection terminal layer 13Bc, as a reference.

In an exemplary embodiment, in the module 10B, when inverted with respect to the reference line S when viewed in the thickness direction T, according to an exemplary aspect, when an area of a region where the first arrangement region of the first anode connection terminal layer 13Aa, the first cathode connection terminal layer 13Ba, the first anode connection terminal layer 13Ab, and the first cathode connection terminal layer 13Bb and the second arrangement region of the first anode connection terminal layer 13Ac and the first cathode connection terminal layer 13Bc overlap each other is referred to as J, and a smaller area among areas of the first arrangement region (that is, the total area of the first anode connection terminal layer 13Aa, the first cathode connection terminal layer 13Ba, the first anode connection terminal layer 13Ab, and the first cathode connection terminal layer 13Bb) and areas of the second arrangement region (that is, the total area of the first anode connection terminal layer 13Ac and the first cathode connection terminal layer 13Bc) is referred to as K, $J \geq K \times 0.95$ is satisfied.

In the module 10B, according to an exemplary aspect, the plurality of first connection terminal layers overlap each other in terms of area by 95% or more and 100% or less when inverted with respect to the reference line S with a smaller area among areas of the first connection terminal layer in each of the two regions divided by the reference line S, as a reference. That is, in the module 10B, in some exemplary embodiments, $K \times 0.95 \leq J \leq K$ is satisfied.

In the example shown in FIG. 9, when inverted with respect to the reference line S when viewed in the thickness direction T, the area of the region where the first arrangement region and the second arrangement region overlap each other is the same as the area of the first arrangement region, and further, a smaller area of the area of the first arrangement region and the area of the second arrangement region is the area of the first arrangement region. Therefore, in the example shown in FIG. 9, the plurality of first connection terminal layers overlap each other in terms of area by 100% when inverted with respect to the reference line S with a smaller area of the areas of the first connection terminal layer in each of the two regions divided by the reference line S, as a reference. In this manner, in the module 10B, in some exemplary embodiments, the plurality of first connection terminal layers overlap each other in terms of area by 100% when inverted with respect to the reference line S with a smaller area of the first connection terminal layer in each of the two regions divided by the reference line S, as a reference. That is, in the module 10B, in some exemplary embodiments, $J=K$ is satisfied.

In the module 10B shown in FIG. 10, on the second main surface 11*b* side of the capacitor layer 11, the second anode connection terminal layer 14Aa and the second cathode connection terminal layer 14Ba corresponding to the capacitor portion C1, the second anode connection terminal layer 14Ab and the second cathode connection terminal layer 14Bb corresponding to the capacitor portion C2, and the second anode connection terminal layer 14Ac and the second cathode connection terminal layer 14Bc corresponding to the capacitor portion C3 are provided as a plurality of second connection terminal layers.

In the module 10B shown in FIG. 10, when viewed in the thickness direction T, when a reference line S passing through the center of the capacitor layer 11 and extending in the direction (in FIG. 10, the up-down direction) orthogonal to the thickness direction T is defined, according to an exemplary aspect, the plurality of second connection terminal layers overlap each other in terms of area by 95% or more when inverted with respect to the reference line S with a smaller area among areas of the second connection terminal layer in each of two regions divided by the reference line S as a reference.

That is, in the module 10B, the plurality of second connection terminal layers are divided into two regions, that is, a region (in FIG. 10, the right region) where the second anode connection terminal layer 14Aa, the second cathode connection terminal layer 14Ba, the second anode connection terminal layer 14Ab, and the second cathode connection terminal layer 14Bb are disposed by the reference line S, and a region (in FIG. 10, the left region) where the second anode connection terminal layer 14Ac and the second cathode connection terminal layer 14Bc are disposed. In addition, in each of the two regions, according to an exemplary aspect, the plurality of second connection terminal layers overlap each other in terms of area by 95% or more when inverted with respect to the reference line S with a smaller area among areas of the second connection terminal layer, that is, a smaller area of the total area of the second anode connection terminal layer 14Aa, the second cathode connection terminal layer 14Ba, the second anode connection terminal layer 14Ab, and the second cathode connection terminal layer 14Bb and the total area of the second anode connection terminal layer 14Ac and the second cathode connection terminal layer 14Bc, as a reference.

In an exemplary embodiment, in the module 10B, when inverted with respect to the reference line S when viewed in the thickness direction T, according to an exemplary aspect, when an area of a region where the third arrangement region of the second anode connection terminal layer 14Aa, the second cathode connection terminal layer 14Ba, the second anode connection terminal layer 14Ab, and the second cathode connection terminal layer 14Bb and the fourth arrangement region of the second anode connection terminal layer 14Ac and the second cathode connection terminal layer 14Bc overlap each other is referred to as M, and a smaller area among areas of the third arrangement region (that is, the total area of the second anode connection terminal layer 14Aa, the second cathode connection terminal layer 14Ba, the second anode connection terminal layer 14Ab, and the second cathode connection terminal layer 14Bb) and areas of the fourth arrangement region (that is, the total area of the second anode connection terminal layer 14Ac and the second cathode connection terminal layer 14Bc) is referred to as N, $M \geq N \times 0.95$ is satisfied.

In the module 10B, in some exemplary embodiments, the plurality of second connection terminal layers overlap each other in terms of area by 95% or more and 100% or less when inverted with respect to the reference line S with a smaller area among areas of the second connection terminal layer in each of the two regions divided by the reference line S, as a reference. That is, in the module 10B, in some exemplary embodiments, $N \times 0.95 \leq M \leq N$ is satisfied.

In the example shown in FIG. 10, when inverted with respect to the reference line S when viewed in the thickness direction T, the area of the region where the third arrangement region and the fourth arrangement region overlap each other is the same as the area of the third arrangement region, and further, a smaller area of the area of the third arrangement region and the area of the fourth arrangement region is the area of the third arrangement region. Therefore, in the example shown in FIG. 10, the plurality of second connection terminal layers overlap each other in terms of area by 100% when inverted with respect to the reference line S with a smaller area of the areas of the second connection terminal layer in each of the two regions divided by the reference line S, as a reference. In this manner, in the module 10B, according to an exemplary aspect, the plurality of second connection terminal layers overlap each other in terms of area by 100% when inverted with respect to the reference line S with a smaller area of the second connection terminal layer in each of the two regions divided by the reference line S, as a reference. That is, according to an exemplary aspect, M=N in the module 10B is satisfied.

As described above, in the module 10B, since the plurality of first connection terminal layers overlap each other in terms of area by 95% or more when inverted with respect to the reference line S with a smaller area among areas of the first connection terminal layer in each of the two regions divided by the reference line S as a reference, and the plurality of second connection terminal layers overlap each other in terms of area by 95% or more when inverted with respect to the reference line S with a smaller area among areas of the second connection terminal layer in each of the two regions divided by the reference line S as a reference. Accordingly, the occurrence of warping and delamination during the heat treatment is sufficiently suppressed.

The degree to which the plurality of connection terminal layers overlap each other in terms of area when inverted with respect to the reference line is determined by using image analysis software to invert the patterns of the plurality of connection terminal layers with respect to the reference line in the captured planar image of the plurality of connection terminal layers, and measuring a rate of match between the areas of the patterns before and after the inversion.

In the module 10B shown in FIG. 9, the first anode connection terminal layer 13Aa and the first anode connection terminal layer 13Ab may be integrated to be electrically connected to the anode plate 51A of the capacitor portion C1 and the anode plate 51B of the capacitor portion C2 in common.

In the module 10B shown in FIG. 9, the first cathode connection terminal layer 13Ba and the first cathode connection terminal layer 13Bb may be integrated with each other to be electrically connected to the cathode layer 56A of the capacitor portion C1 and the cathode layer 56B of the capacitor portion C2 in common.

In the module 10B shown in FIG. 9, the first anode connection terminal layer 13Ac may be divided into two such that the first anode connection terminal layer 13Ac is electrically connected to the anode plate 51C of the capacitor portion C3 and the anode plate 51D of the capacitor portion C4 independently.

In the module 10B shown in FIG. 9, the first cathode connection terminal layer 13Bc may be divided into two such that the first cathode connection terminal layer 13Bc is electrically connected to the cathode layer 56C of the capacitor portion C3 and the cathode layer 56D of the capacitor portion C4 independently.

In the module 10B shown in FIG. 10, the second anode connection terminal layer 14Aa and the second anode connection terminal layer 14Ab may be integrated to be electrically connected to the anode plate 51A of the capacitor portion C1 and the anode plate 51B of the capacitor portion C2 in common.

In the module 10B shown in FIG. 10, the second cathode connection terminal layer 14Ba and the second cathode connection terminal layer 14Bb may be integrated with each other to be electrically connected to the cathode layer 56A of the capacitor portion C1 and the cathode layer 56B of the capacitor portion C2 in common.

In the module 10B shown in FIG. 10, the second anode connection terminal layer 14Ac may be divided into two such that the second anode connection terminal layer 14Ac is electrically connected to the anode plate 51C of the capacitor portion C3 and the anode plate 51D of the capacitor portion C4 independently.

In the module 10B shown in FIG. 10, the second cathode connection terminal layer 14Bc may be divided into two such that the second cathode connection terminal layer 14Bc is electrically connected to the cathode layer 56C of the capacitor portion C3 and the cathode layer 56D of the capacitor portion C4 independently.

REFERENCE SIGNS LIST

1A SEMICONDUCTOR COMPOSITE DEVICE
10A, 10B MODULE
11 CAPACITOR LAYER
11*a* FIRST MAIN SURFACE OF CAPACITOR LAYER
11*b* SECOND MAIN SURFACE OF CAPACITOR LAYER
12 THROUGH-HOLE CONDUCTOR
12A ANODE THROUGH-HOLE CONDUCTOR (FIRST THROUGH-HOLE CONDUCTOR)
12B CATHODE THROUGH-HOLE CONDUCTOR (SECOND THROUGH-HOLE CONDUCTOR)
13 FIRST CONNECTION TERMINAL LAYER
13Aa, 13Ab, 13Ac FIRST ANODE CONNECTION TERMINAL LAYER (FIRST CONNECTION TERMINAL LAYER)
13Ba, 13Bb, 13Bc FIRST CATHODE CONNECTION TERMINAL LAYER (FIRST CONNECTION TERMINAL LAYER)
14 SECOND CONNECTION TERMINAL LAYER
14Aa, 14Ab, 14Ac SECOND ANODE CONNECTION TERMINAL LAYER (SECOND CONNECTION TERMINAL LAYER)
14Ba, 14Bb, 14Bc SECOND CATHODE CONNECTION TERMINAL LAYER (SECOND CONNECTION TERMINAL LAYER)
15 CONNECTION TERMINAL LAYER
20 VOLTAGE REGULATOR
30 LOAD
40 MOTHER SUBSTRATE
51A, 51B, 51C, 51D ANODE PLATE
52A CORE PORTION
54A POROUS LAYER
56A, 56B, 56C, 56D CATHODE LAYER
56Aa SOLID ELECTROLYTE LAYER
56Ab CONDUCTOR LAYER
61 ANODE THROUGH-HOLE
62 CATHODE THROUGH-HOLE
70 ANODE CONNECTION LAYER
70A FIRST ANODE CONNECTION LAYER
70B SECOND ANODE CONNECTION LAYER
71A FIRST RESIN-FILLED PORTION
71B SECOND RESIN-FILLED PORTION
80A FIRST INSULATING LAYER
80B SECOND INSULATING LAYER
81 INSULATING PORTION
81A FIRST INSULATING PORTION
81B SECOND INSULATING PORTION
82 VIA CONDUCTOR
C1, C2, C3, C4 CAPACITOR PORTION
L1 INDUCTOR
T THICKNESS DIRECTION

What is claimed:

1. A module, comprising:

a plurality of stacking layers configured to form a capacitor;

one or more through-hole conductors that extend through the plurality of stacking layers in a thickness direction of the plurality of stacking layers; and one or more connection terminals that are patterned in one or more connection terminal layers, the one or more connection terminals being coupled to the one or more through-hole conductors, wherein:

the plurality of stacking layers have a first main surface side and a second main surface side that are opposite to each other in the thickness direction;

the one or more connection terminals include a first anode connection terminal at the first main surface side of the plurality of stacking layers, a second anode connection terminal at the second main surface side of the plurality of stacking layers, a first cathode connection terminal at the first main surface side of the plurality of stacking layers, and a second cathode connection terminal at the second main surface side of the plurality of stacking layers;

the first anode connection terminal and the second anode connection terminal are respectively coupled to an anode of the capacitor;

the first cathode connection terminal and the second cathode connection terminal are respectively coupled to a cathode of the capacitor in a cathode layer by one or more via conductors;

an entirety of each of the first anode connection terminal and the first cathode connection terminal overlap an entirety of the cathode layer in the thickness direction by 90% or more of a total area of the cathode layer; and an entirety of each of the second anode connection terminal and the second cathode connection terminal overlap an entirety of the cathode layer in the thickness direction by 90% or more of a total area of the cathode layer.

2. The module according to claim 1, wherein an overlapped pattern area of a first combination of the first anode connection terminal and the first cathode connection terminal at the first main surface side with a second combination of the second anode connection terminal and the second cathode connection terminal at the second main surface side in the thickness direction is 95% or more of a smaller one of the first combination and the second combination.

3. The module according to claim 1, wherein the plurality of stacking layers are configured to form the capacitor as a combination of a plurality of capacitor portions that are disposed in a plane.

4. The module according to claim 1, wherein the plurality of stacking layers are divided into a plurality of capacitor portions.

5. The module according to claim 1, wherein:

the one or more connection terminals include a plurality of first connection terminals at the first main surface side of the plurality of stacking layers and a plurality of second connection terminals at the second main surface side of the plurality of stacking layers, the plurality of first connection terminals including the first anode connection terminal and the first cathode connection terminal, and the plurality of second connection terminals including the second anode connection terminal and the second cathode connection terminal, a first combined pattern of the plurality of first connection terminals overlaps a first combined inverted pattern that is an inverted pattern of the first combined pattern by 95% or more of a smaller one of the first combined pattern and the first combined inverted pattern, and a second combined pattern of the plurality of second connection terminals overlaps a second combined inverted pattern that is an inverted pattern of the second combined pattern by 95% or more of a smaller one of the second combined pattern and the second combined inverted pattern.

6. The module according to claim 1, wherein an area of the plurality of stacking layers that form the capacitor is about 200 $mm^2$ or more.

7. The module according to claim 1, wherein a dimension of the plurality of stacking layers in the thickness direction is 300 μm or less.

8. The module according to claim 1, wherein a first dimension of the plurality of stacking layers in the thickness direction is 1/10 or less of a minimum dimension in a direction orthogonal to the thickness direction.

9. The module according to claim 1, wherein:

the one or more through-hole conductors include an anode through-hole conductor that is configured to have a conductive layer on an inner wall surface of an anode through-hole extending in the plurality of stacking layers in the thickness direction, and the anode through-hole conductor is coupled to the anode of the capacitor by the conductive layer on the inner wall surface of the anode through-hole.

10. A semiconductor composite device comprising:

a voltage regulator configured to provide a direct current voltage to a load; and a module that includes:

a plurality of stacking layers configured to form a capacitor;

one or more through-hole conductors that extend through the plurality of stacking layers in a thickness direction of the plurality of stacking layers and are configured to couple the capacitor with at least one of the voltage regulator or the load; and one or more connection terminals that are patterned in one or more connection terminal layers, the one or more connection terminals being coupled to the one or more through-hole conductors and being configured to couple the capacitor with at least one of the voltage regulator or the load of the voltage regulator, wherein:

the plurality of stacking layers have a first main surface side and a second main surface side that are opposite to each other in the thickness direction;

the one or more connection terminals include a first anode connection terminal at the first main surface side of the plurality of stacking layers, a second anode connection terminal at the second main surface side of the plurality of stacking layers, a first cathode connection terminal at the first main surface side of the plurality of stacking layers, and a second cathode connection terminal at the second main surface side of the plurality of stacking layers;

the first anode connection terminal and the second anode connection terminal are respectively coupled to an anode of the capacitor;

the first cathode connection terminal and the second cathode connection terminal are respectively coupled to a cathode of the capacitor formed in a cathode layer by one or more via conductors;

an entirety of each of the first anode connection terminal and the first cathode connection terminal overlap an entirety of the cathode layer in the thickness direction by 90% or more of a total area of the cathode layer; and an entirety of each of the second anode connection terminal and the second cathode connection terminal overlap an entirety of the cathode layer in the thickness direction by 90% or more of a total area of the cathode layer.

11. The semiconductor composite device according to claim 10, wherein an area of the plurality of stacking layers in the thickness direction is larger than an area of the load.

12. A module, comprising:

a plurality of stacking layers configured to form a capacitor;

one or more through-hole conductors that extend through the plurality of stacking layers in a thickness direction of the plurality of stacking layers; and one or more connection terminals that are patterned in one or more connection terminal layers, the one or more connection terminals being coupled to the one or more through-hole conductors, wherein:

the plurality of stacking layers have a first main surface side and a second main surface side that are opposite to each other in the thickness direction;

the one or more connection terminals include a first anode connection terminal at the first main surface side of the plurality of stacking layers, a second anode connection terminal at the second main surface side of the plurality of stacking layers, a first cathode connection terminal at the first main surface side of the plurality of stacking layers, and a second cathode connection terminal at the second main surface side of the plurality of stacking layers;

the first anode connection terminal and the second anode connection terminal are respectively coupled to an anode of the capacitor;

the first cathode connection terminal and the second cathode connection terminal are respectively coupled to a cathode of the capacitor in a cathode layer by one or more via conductors;

a first sum of a first overlapped pattern area of the first anode connection terminal with the cathode layer in the thickness direction, and a second overlapped pattern area of the first cathode connection terminal with the cathode layer in the thickness direction is equal to or more than a first pre-determined threshold percentage of a total area of the cathode layer, the first pre-determined threshold percentage being determined based on a target thermal characteristic difference of the one or more connection terminals to the cathode layer; and a second sum of a third overlapped pattern area of the second anode connection terminal with the cathode layer in the thickness direction and a fourth overlapped pattern area of the second cathode connection terminal with the cathode layer in the thickness direction is equal to or more than the first pre-determined threshold percentage of the total area of the cathode layer.

13. The module according to claim 12, wherein an overlapped pattern area of a first combination of the first anode connection terminal and the first cathode connection terminal at the first main surface side with a second combination of the second anode connection terminal and the second cathode connection terminal at the second main surface side in the thickness direction is 95% or more of a smaller one of the first combination and the second combination.

14. The module according to claim 12, wherein the plurality of stacking layers are configured to form the capacitor as a combination of a plurality of capacitor portions that are disposed in a plane.

15. The module according to claim 12, wherein the plurality of stacking layers are divided into a plurality of capacitor portions.

16. The module according to claim 12, wherein:

the one or more connection terminals include a plurality of first connection terminals at the first main surface side of the plurality of stacking layers and a plurality of second connection terminals at the second main surface side of the plurality of stacking layers, the plurality of first connection terminals including the first anode connection terminal and the first cathode connection terminal, and the plurality of second connection terminals including the second anode connection terminal and the second cathode connection terminal, a first combined pattern of the plurality of first connection terminals overlaps a first combined inverted pattern that is an inverted pattern of the first combined pattern by 95% or more of a smaller one of the first combined pattern and the first combined inverted pattern, and a second combined pattern of the plurality of second connection terminals overlaps a second combined inverted pattern that is an inverted pattern of the second combined pattern by 95% or more of a smaller one of the second combined pattern and the second combined inverted pattern.

17. The module according to claim 12, wherein an area of the plurality of stacking layers that form the capacitor is 200 $mm^2$ or more.

18. The module according to claim 12, wherein a dimension of the plurality of stacking layers in the thickness direction is 300 μm or less.

19. The module according to claim 12, wherein a first dimension of the plurality of stacking layers in the thickness direction is 1/10 or less of a minimum dimension in a direction orthogonal to the thickness direction.

20. The module according to claim 12, wherein:

the one or more through-hole conductors include an anode through-hole conductor that is configured to have a conductive layer on an inner wall surface of an anode through-hole extending the plurality of stacking layers in the thickness direction, and the anode through-hole conductor is coupled to the anode of the capacitor by the conductive layer on the inner wall surface of the anode through-hole.

* * * * *